(12) United States Patent
Kim et al.

(10) Patent No.: US 12,557,409 B2
(45) Date of Patent: Feb. 17, 2026

(54) IMAGE SENSOR

(71) Applicant: Samsung Electronics Co., Ltd., Suwon-si (KR)

(72) Inventors: Ji Hun Kim, Suwon-si (KR); Jung Bin Yun, Hwaseong-si (KR); Seung Joon Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 479 days.

(21) Appl. No.: 17/966,576

(22) Filed: Oct. 14, 2022

(65) Prior Publication Data

US 2023/0275106 A1    Aug. 31, 2023

(30) Foreign Application Priority Data

Feb. 7, 2022  (KR) .................. 10-2022-0015361

(51) Int. Cl.
*H10F 39/18*  (2025.01)
*H10F 39/00*  (2025.01)

(52) U.S. Cl.
CPC ..... *H10F 39/80373* (2025.01); *H10F 39/182* (2025.01); *H10F 39/807* (2025.01)

(58) Field of Classification Search
CPC ............ H10F 39/80373; H10F 39/182; H10F 39/807; H10F 39/014; H10F 39/12; H10F 39/199; H10F 39/802; H10F 39/8023; H10F 39/8027; H10F 39/8033; H10F 39/8037; H10F 39/8053; H10F 39/8063; H10F 39/812; H10F 39/813; H10F 39/191; H10F 39/18–1898; H10F 39/186–1865; H10D 84/0188; H10D 84/0165–0195; H10D 84/84–859; H10D 84/907–994; H10D 30/69–699; H04N 25/77

See application file for complete search history.

(56) References Cited

U.S. PATENT DOCUMENTS 8,860,099 B2   10/2014  Tatani et al.
10,325,953 B2   6/2019  Kawahito
(Continued)

FOREIGN PATENT DOCUMENTS

KR   20140093029 A    7/2014
KR   1020160091244 A  8/2016
KR   1020210003492 A  1/2021

*Primary Examiner* — Steven B Gauthier
*Assistant Examiner* — Adam D Weiland
(74) *Attorney, Agent, or Firm* — Muir Patent Law, PLLC

(57) ABSTRACT

An image sensor is provided. The image sensor includes a substrate in which a first photoelectric conversion element is disposed, the substrate having a first surface and a second surface opposite the first surface, pixel separation patterns extending from the first surface of the substrate into the substrate, surrounding the first photoelectric conversion element, and defining a first pixel region in the substrate, a first vertical gate structure which extends in the first pixel region from the first surface of the substrate into the substrate and comprises a first portion disposed in the substrate and a second portion disposed on the first surface of the substrate, a second vertical gate structure which extends in the first pixel region from the first surface of the substrate into the substrate and comprises a first portion disposed in the substrate and a second portion disposed on the first surface of the substrate.

20 Claims, 22 Drawing Sheets

(56) References Cited

U.S. PATENT DOCUMENTS

| | | | |
|---|---|---|---|
| 10,818,710 B2 | 10/2020 | Lim | |
| 11,011,569 B2 | 5/2021 | Lee | |
| 2011/0073923 A1* | 3/2011 | Tatani | H10F 39/803 |
| | | | 438/59 |
| 2019/0115388 A1* | 4/2019 | Jung | H10F 39/813 |
| 2019/0131326 A1* | 5/2019 | Kim | H10F 39/8033 |
| 2019/0267429 A1* | 8/2019 | Zhang | H10K 39/32 |
| 2020/0350358 A1 | 11/2020 | Watanabe et al. | |
| 2021/0005652 A1* | 1/2021 | Gu | H10F 39/18 |
| 2021/0020674 A1* | 1/2021 | Woo | H10F 39/8027 |
| 2021/0151478 A1* | 5/2021 | Iwabuchi | H10F 39/807 |
| 2022/0130885 A1* | 4/2022 | Zang | H10F 39/812 |
| 2024/0163587 A1* | 5/2024 | Asahi | H10F 39/1865 |

\* cited by examiner

IMAGE SENSOR

CROSS-REFERENCE TO RELATED APPLICATION

This application claims priority to Korean Patent Application No. 10-2022-0015361 filed on Feb. 7, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an image sensor.

2. Description of the Related Art

An image sensing device may be an element of a semiconductor device that is configured to convert optical information into an electrical signal. Such an image sensor may include or may be a charge coupled device (CCD) image sensing device and a complementary metal-oxide semiconductor (CMOS) image sensing device.

A CMOS images sensor (CIS) may include a plurality of pixels that are two-dimensionally arranged, and each of the pixels may include, for example, a photodiode (PD). The photodiode may convert incident light into an electrical signal.

With the recent development of the computer industry and the communication industry, the demand for an image sensing device with reduced size and improved performance is increasing in various fields such as digital cameras, camcorders, smartphones, game devices, security service cameras, medical micro cameras, robots, etc. Accordingly, research on highly integrated semiconductor devices in image sensing devices is in progress and patterns of the semiconductor devices may have a fine width and may be spaced apart from each other at a fine pitch.

SUMMARY

Aspects of the present disclosure provide an image sensor having improved transmission characteristics of vertical gate structures by arranging two vertical gate structures in one unit pixel such that spacing between the two vertical gate structures decreases in a horizontal direction approaching a floating diffusion region in the one unit pixel.

According to an exemplary embodiment of the present disclosure, there is provided an image sensor, comprising a substrate in which a first photoelectric conversion element is disposed, the substrate including a first surface and a second surface opposite the first surface, pixel separation patterns extending from the first surface of the substrate into the substrate, surrounding the first photoelectric conversion element, and defining a first pixel region in the substrate, a first vertical gate structure which extends in the first pixel region from the first surface of the substrate into the substrate and comprises a first portion disposed in the substrate and a second portion disposed on the first surface of the substrate, a second vertical gate structure which extends in the first pixel region from the first surface of the substrate into the substrate, the second vertical gate structure including a first portion disposed in the substrate and a second portion disposed on the first surface of the substrate, and a floating diffusion region which is disposed at an edge of the first pixel region in the substrate, is disposed between the first portion of the first vertical gate structure and the first portion of the second vertical gate structure, and has an upper surface formed on the same plane as the first surface of the substrate, wherein a width of the first portion of the first vertical gate structure in a horizontal direction gradually decreases in a horizontal direction approaching the floating diffusion region, the first portion of the first vertical gate structure comprises a first sidewall facing the first portion of the second vertical gate structure, the first portion of the second vertical gate structure comprises a second sidewall facing the first portion of the first vertical gate structure, and spacing between the first sidewall and the second sidewall decreases in a horizontal direction approaching the floating diffusion region.

According to an exemplary embodiment of the present disclosure, there is provided an image sensor, comprising a substrate in which a first photoelectric conversion element and a second photoelectric conversion element are disposed, the substrate having a first surface and a second surface opposite the first surface, pixel separation patterns which extend from the first surface of the substrate into the substrate, surround each of the first and second photoelectric conversion elements, and define a first pixel region in which the first photoelectric conversion element is disposed and a second pixel region in which the second photoelectric conversion element is disposed in the substrate, a first vertical gate structure which extends in the first pixel region from the first surface of the substrate into the substrate and comprises a first portion disposed in the substrate and a second portion disposed on the first surface of the substrate, a second vertical gate structure which extends in the first pixel region from the first surface of the substrate into the substrate, the second vertical gate structure including a first portion disposed in the substrate and a second portion disposed on the first surface of the substrate, a third vertical gate structure which extends in the second pixel region from the first surface of the substrate into the substrate and comprises a first portion disposed in the substrate and a second portion disposed on the first surface of the substrate, a fourth vertical gate structure which extends in the second pixel region from the first surface of the substrate into the substrate, the fourth vertical gate structure including a first portion disposed in the substrate and a second portion disposed on the first surface of the substrate, and floating diffusion regions each of which is disposed at an edge of one of the first and second pixel regions in the substrate, the floating diffusion regions respectively disposed between the first portion of the first vertical gate structure and the first portion of the second vertical gate structure and between the first portion of the third vertical gate structure and the first portion of the fourth vertical gate structure, and each of the floating diffusion regions has an upper surface formed on the same plane as the first surface of the substrate, wherein the first portion of the first vertical gate structure comprises a first sidewall facing the first portion of the second vertical gate structure, the first portion of the second vertical gate structure comprises a second sidewall facing the first portion of the first vertical gate structure, and spacing between the first sidewall and the second sidewall decreases in a horizontal direction approaching the floating diffusion region disposed at the edge of the first pixel region.

According to an exemplary embodiment of the present disclosure, there is provided an image sensor, comprising a substrate in which a first photoelectric conversion element is disposed, the substrate having a first surface and a second surface opposite the first surface, pixel separation patterns extending from the first surface of the substrate into the substrate, surrounding the first photoelectric conversion element, and defining a first pixel region in the substrate, a first vertical gate structure which extends in the first pixel region from the first surface of the substrate into the substrate and comprises a first portion disposed in the substrate and a second portion disposed on the first surface of the substrate, a second vertical gate structure which extends in the first pixel region from the first surface of the substrate into the substrate, the second vertical gate structurer including a first portion disposed in the substrate and a second portion disposed on the first surface of the substrate, and a floating diffusion region which is disposed at an edge of the first pixel region in the substrate, is disposed between the first portion of the first vertical gate structure and the first portion of the second vertical gate structure, has an upper surface formed on the same plane as the first surface of the substrate, and does not overlap the pixel separation patterns in a vertical direction, wherein each of the first portion of the first vertical gate structure and the first portion of the second vertical gate structure has a triangular shape in a plan view, an angle between two sidewalls of the first portion of the first vertical gate structure on a horizontal plane at a closest vertex to the floating diffusion region is greater than or equal to 30 degrees and less than 45 degrees, an angle between two sidewalls of the first portion of the second vertical gate structure on a horizontal plane at a closest vertex adjacent to the floating diffusion region is greater than or equal to 30 degrees and less than 45 degrees, the first portion of the first vertical gate structure comprises a first sidewall facing the first portion of the second vertical gate structure, the first portion of the second vertical gate structure comprises a second sidewall facing the first portion of the first vertical gate structure, and spacing between the first sidewall and the second sidewall decreases in a horizontal direction approaching the floating diffusion region.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, an image sensor according to some embodiments of the present disclosure will be described with reference to FIGS. 1 to 9.

Figure 1:
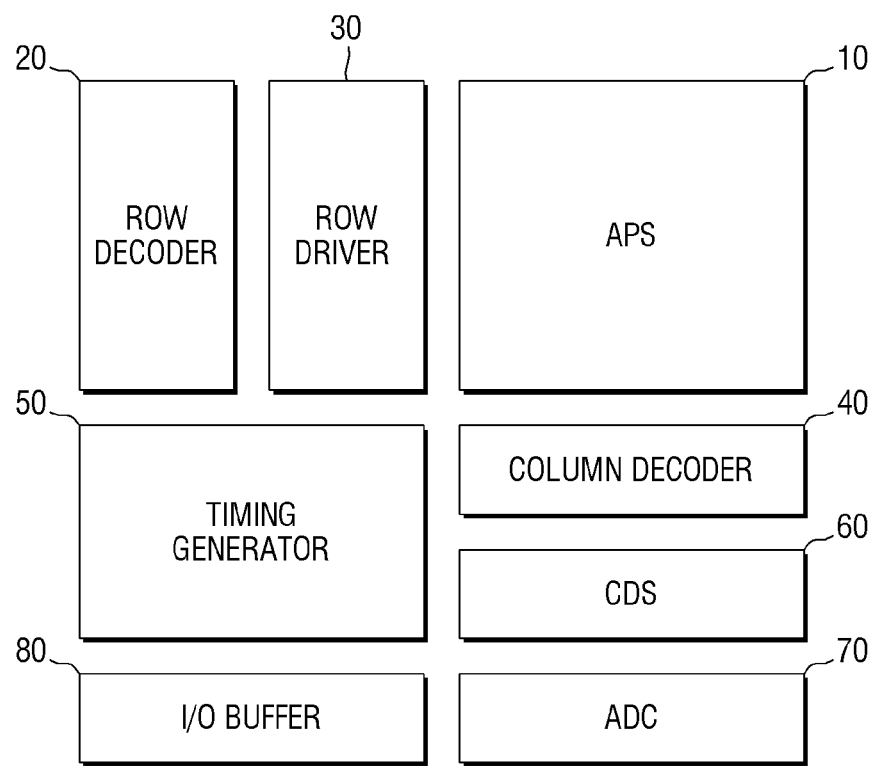
FIG. 1 is a block diagram illustrating an image sensor according to some embodiments of the present disclosure.
Figure 2:
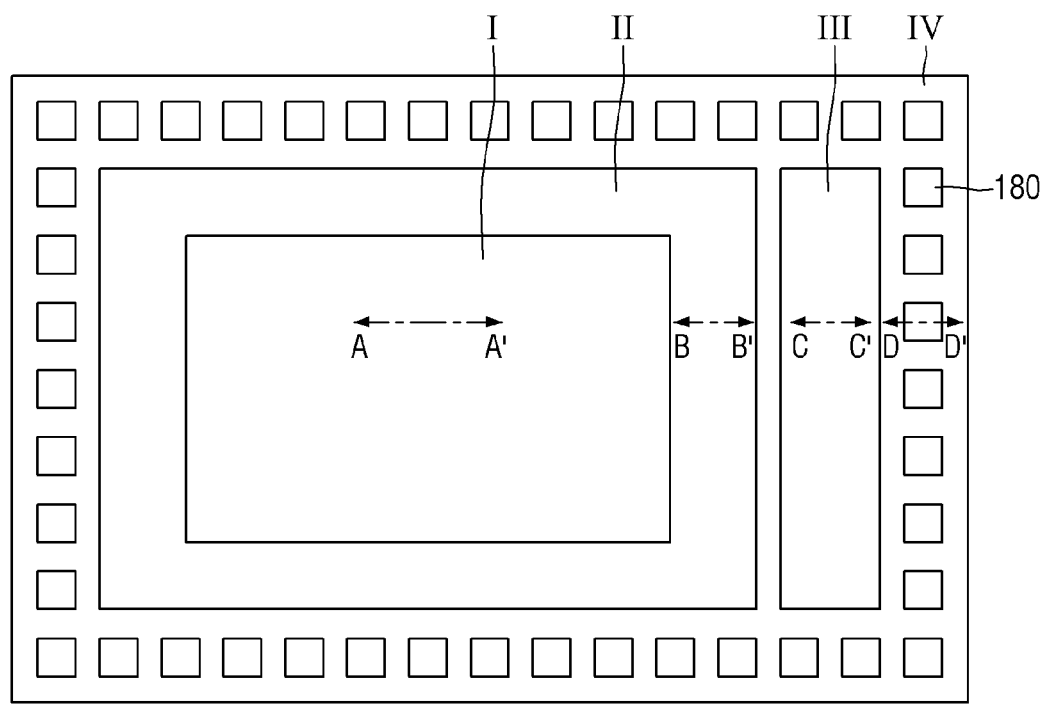
FIG. 2 is a schematic plan view illustrating an image sensor according to some embodiments of the present disclosure.
Figure 2:
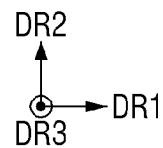
Figure 3:
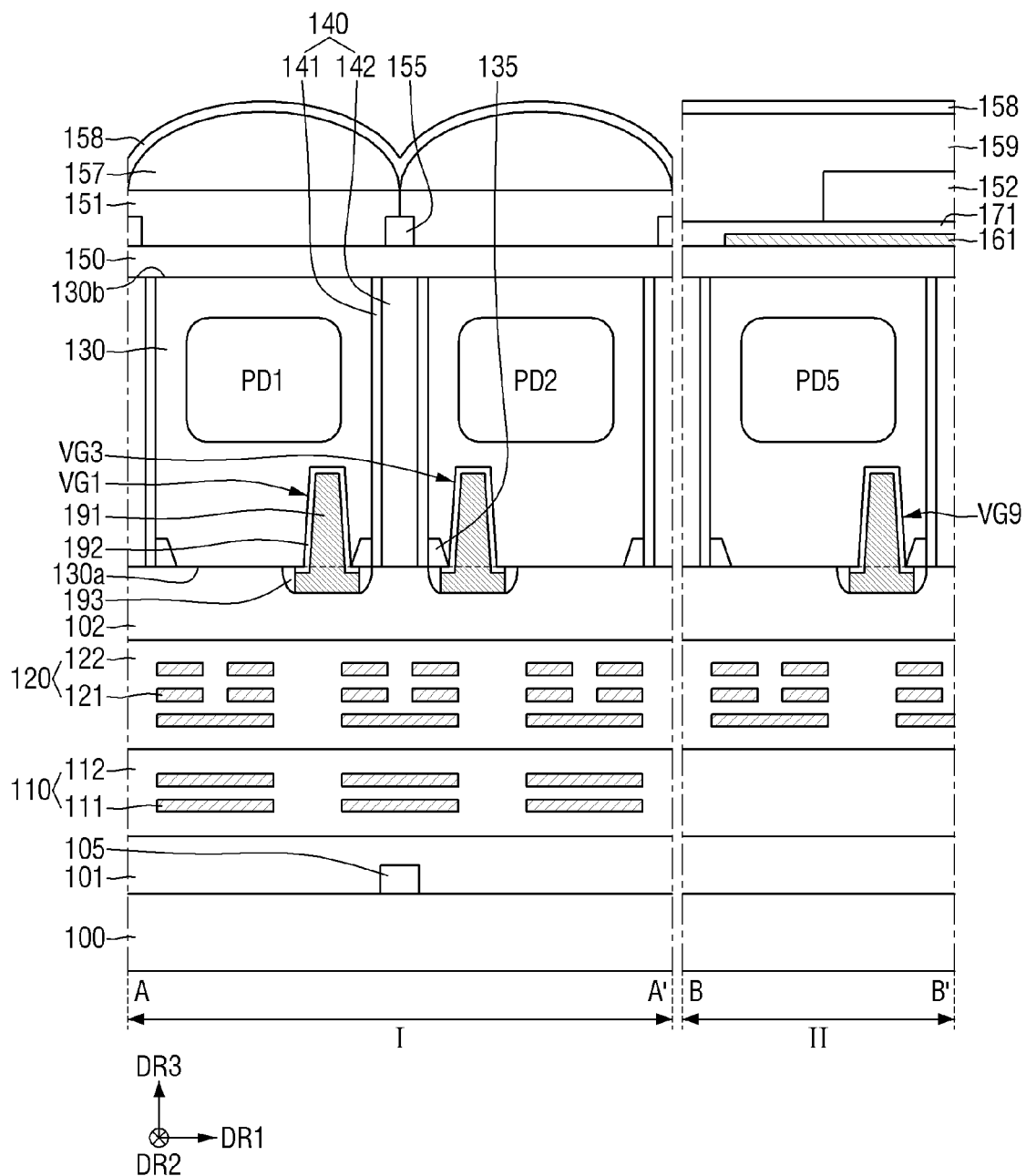
FIG. 3 is a cross-sectional view taken along lines A-A' and B-B' of FIG. 2.
Figure 4:
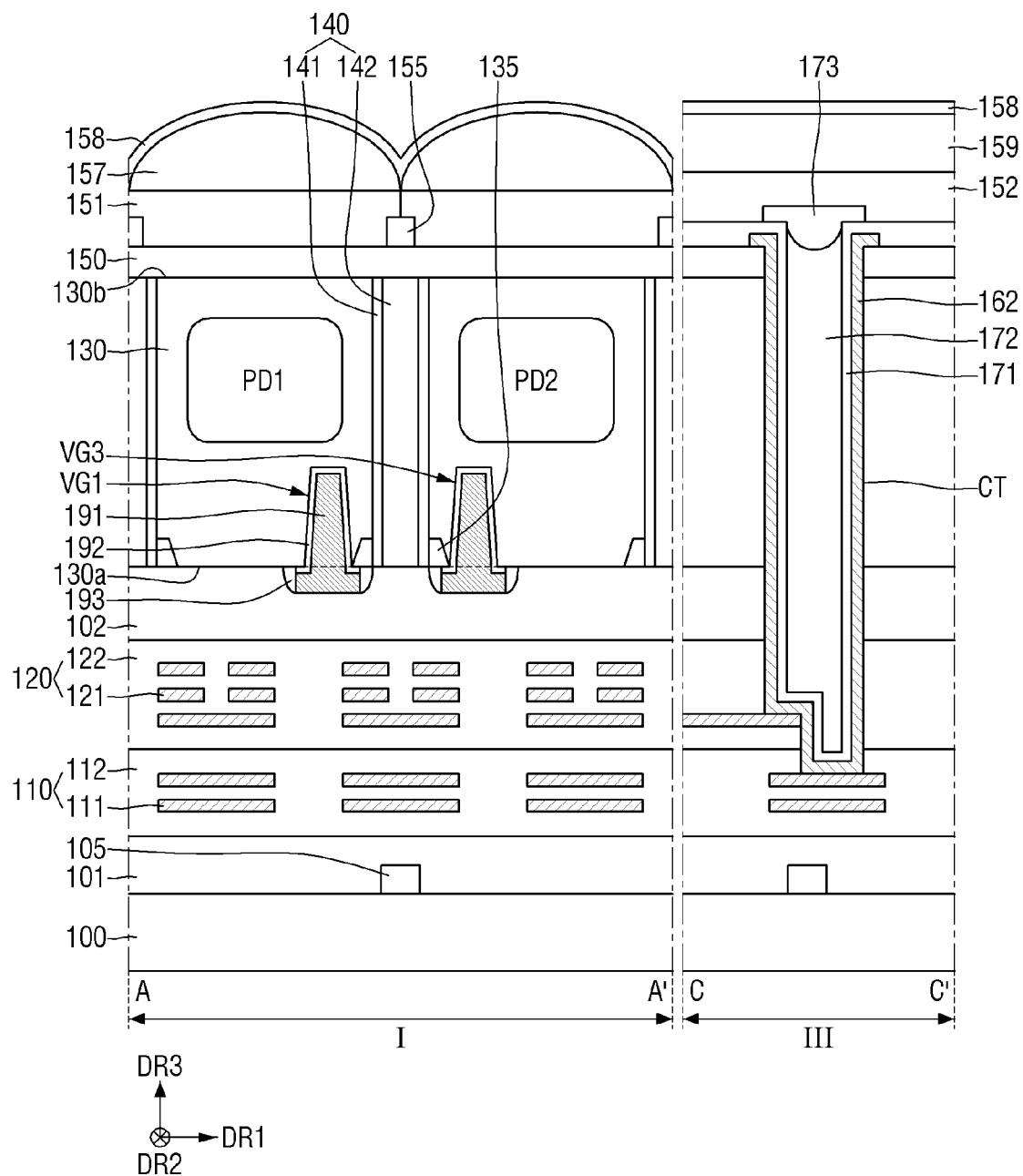
FIG. 4 is a cross-sectional view taken along lines A-A' and C-C' of FIG. 2.
Figure 5:
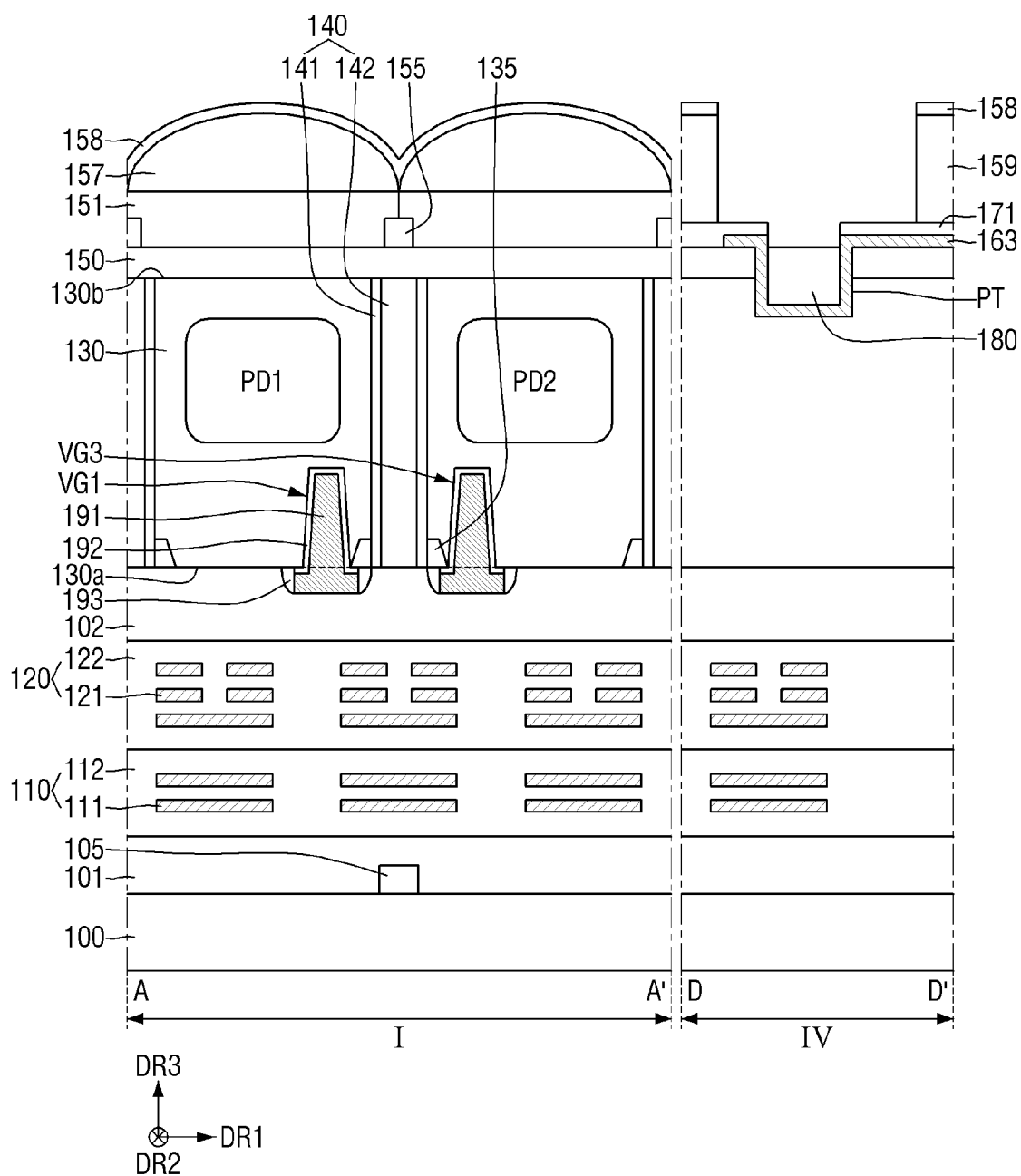
FIG. 5 is a cross-sectional view taken along lines A-A' and D-D' of FIG. 2.
Figure 6:
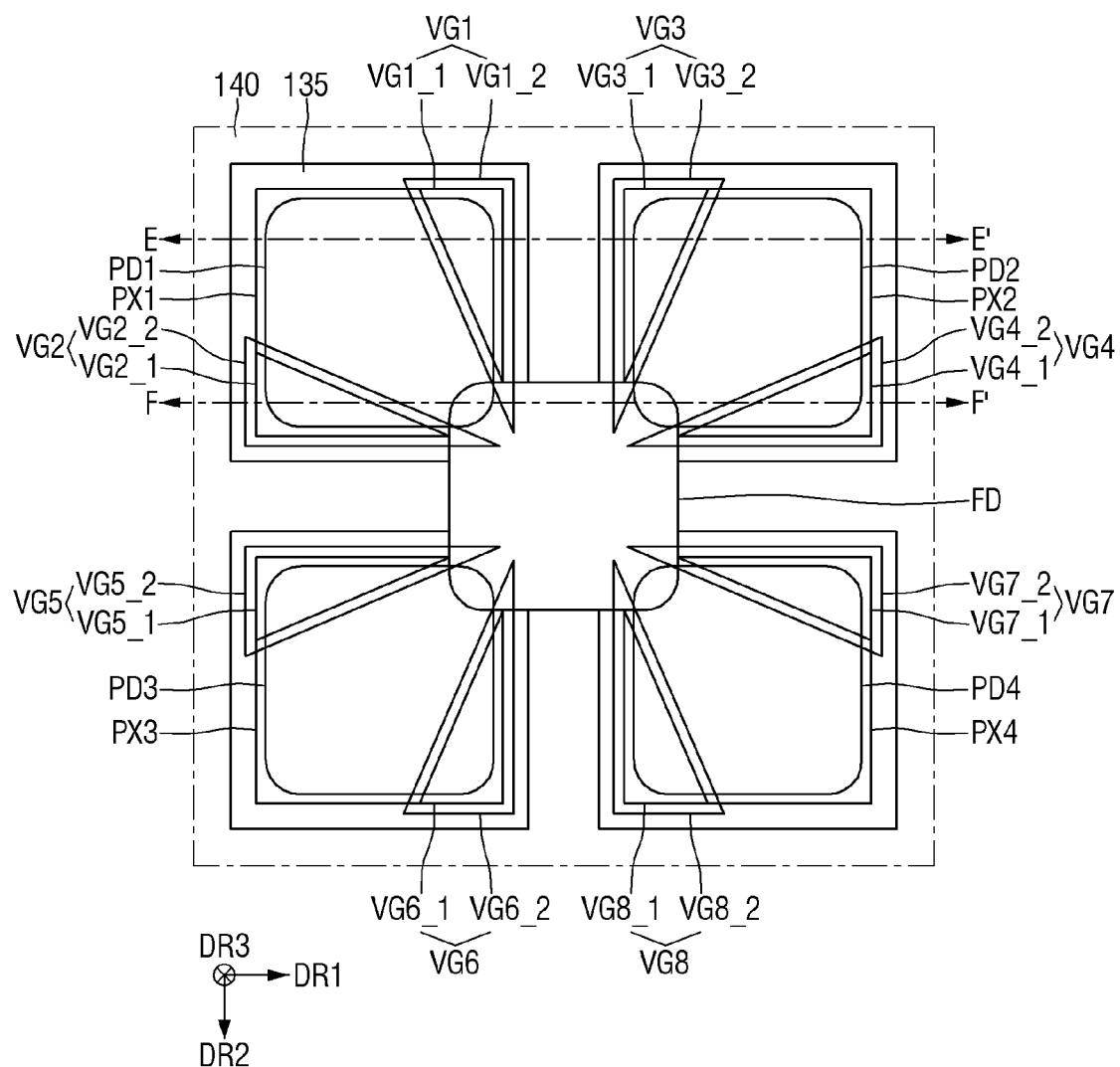
FIGS. 6 and 7 are plan views illustrating a vertical gate structure of an image sensor according to some embodiments of the present disclosure.
Figure 7:
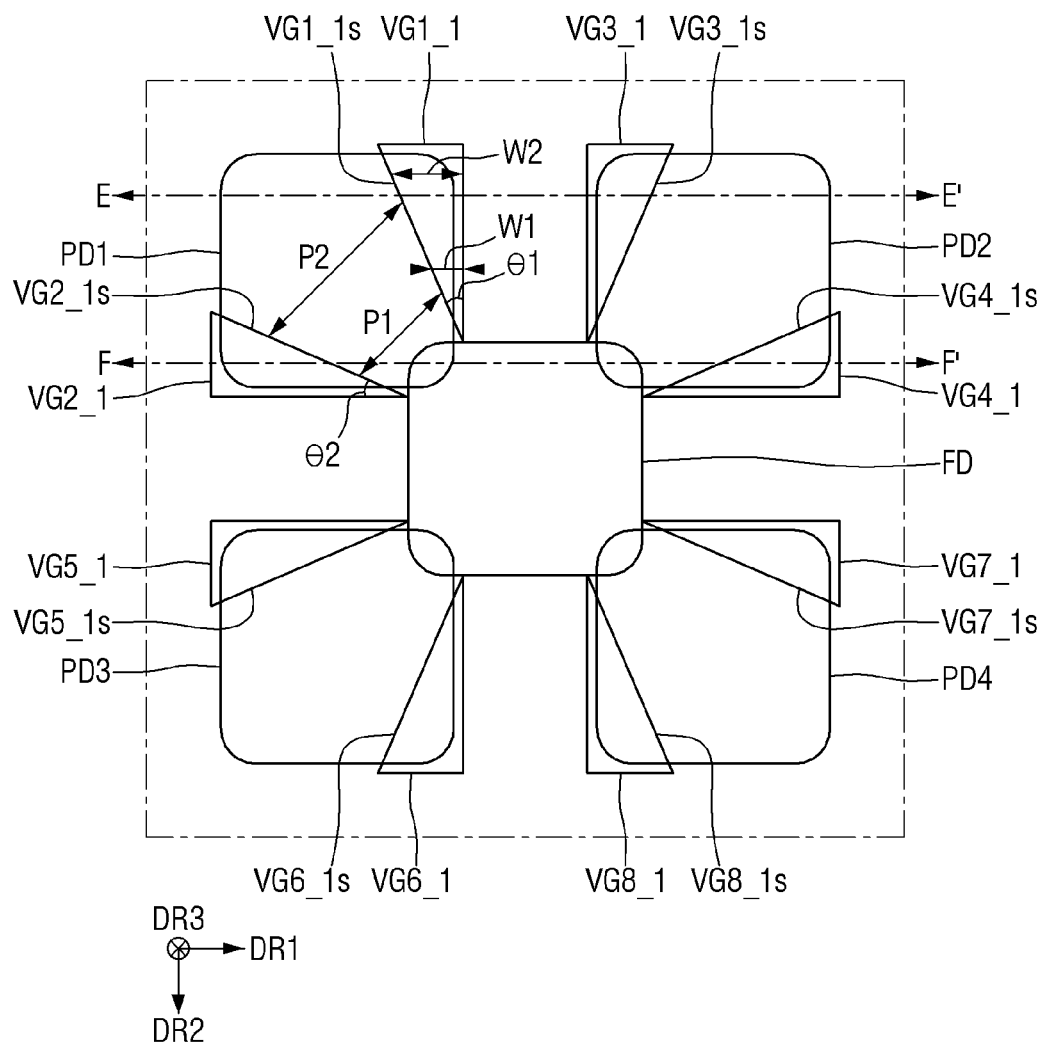
Figure 8:
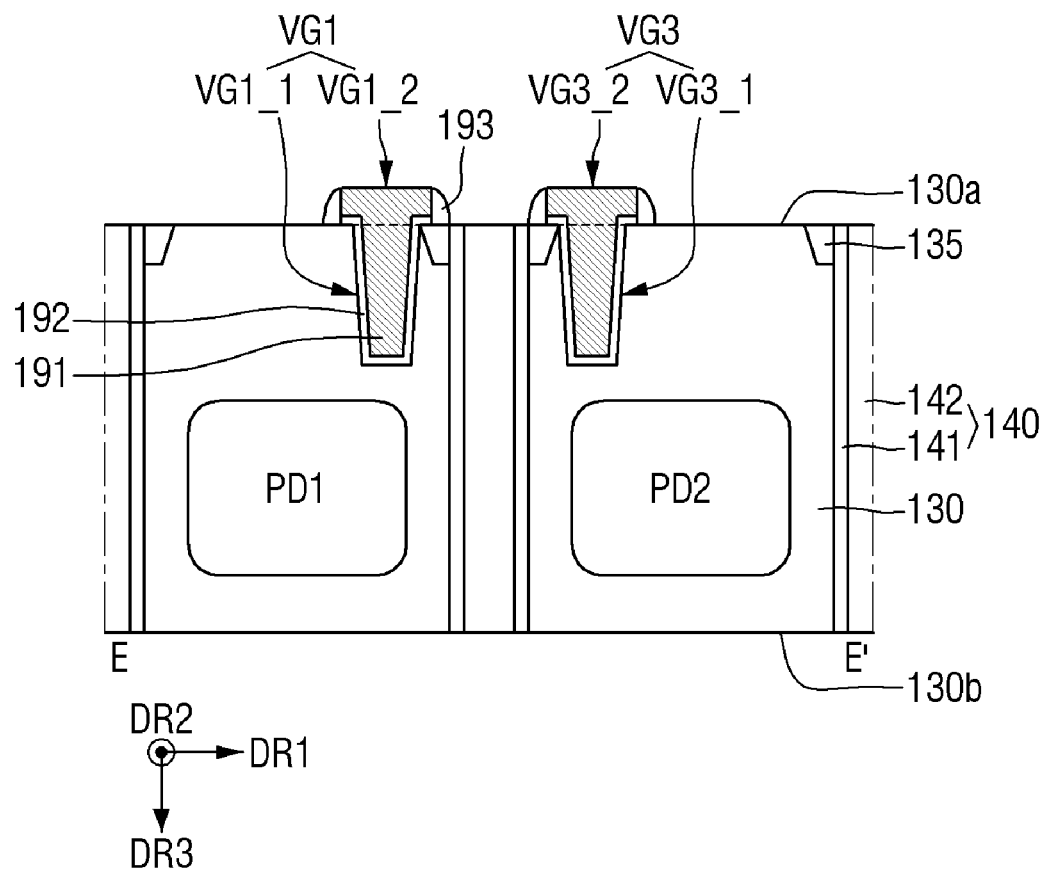
FIG. 8 is a cross-sectional view taken along line E-E' of each of FIGS. 6 and 7.
Figure 9:
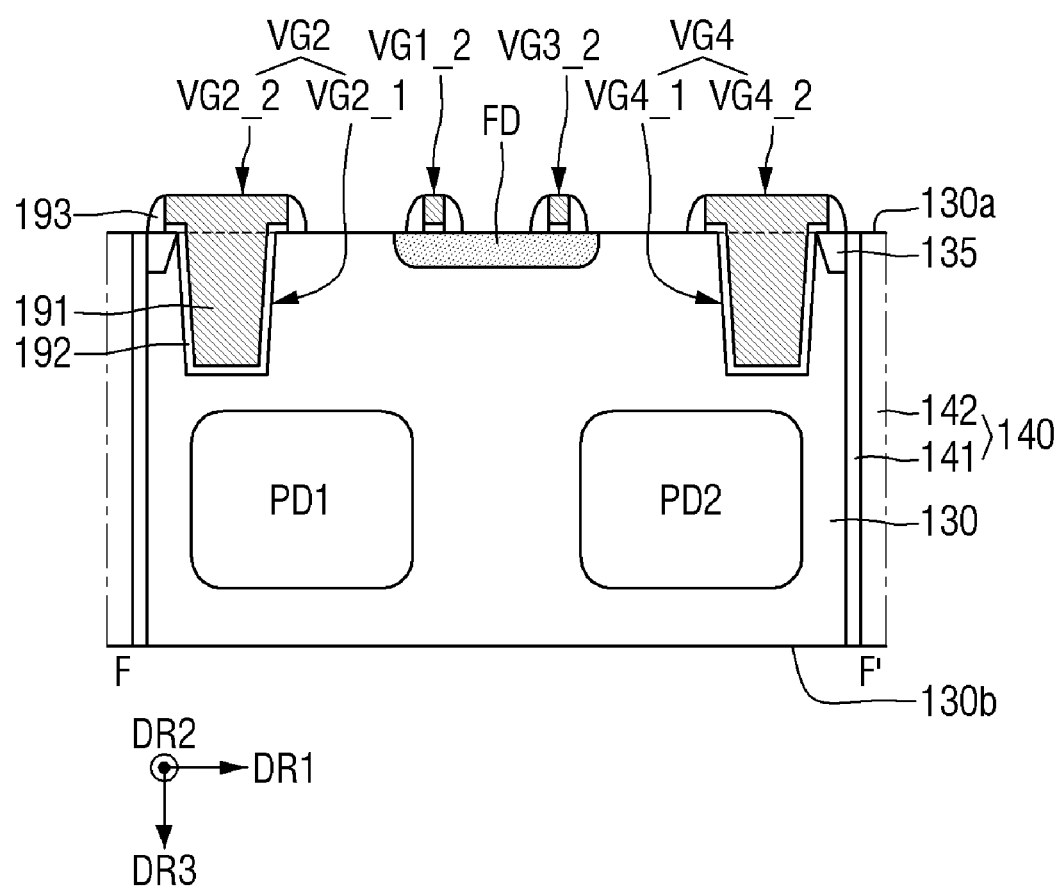
FIG. 9 is a cross-sectional view taken along line F-F' of each of FIGS. 6 and 7.

FIG. 1 is a block diagram illustrating an image sensor according to some embodiments of the present disclosure. FIG. 2 is a schematic plan view illustrating an image sensor according to some embodiments of the present disclosure. FIG. 3 is a cross-sectional view taken along lines A-A' and B-B' of FIG. 2. FIG. 4 is a cross-sectional view taken along lines A-A' and C-C' of FIG. 2. FIG. 5 is a cross-sectional view taken along lines A-A' and D-D' of FIG. 2. FIGS. 6 and 7 are plan views illustrating a vertical gate structure of an image sensor according to some embodiments of the present disclosure. FIG. 8 is a cross-sectional view taken along line E-E' of each of FIGS. 6 and 7. FIG. 9 is a cross-sectional view taken along line F-F' of each of FIGS. 6 and 7.

Referring to FIG. 1, an image sensor according to some embodiments includes an active pixel sensor (APS) array 10, a row decoder 20, a row driver 30, a column decoder 40, a timing generator 50, a correlated double sampler (CDS) 60, an analog-to-digital converter (ADC) 70, and an input/output buffer (I/O buffer) 80.

The APS array 10 includes a plurality of unit pixels two-dimensionally arranged, and may convert an optical signal into an electric signal. The APS array 10 may be driven by a plurality of driving signals, such as pixel selection signals, reset signals, and charge transfer signals, from the row driver 30. The electrical signal converted by the APS array 10 may be provided to the CDS 60.

The row driver 30 may provide a plurality of driving signals for driving a plurality of unit pixels to the APS array 10 according to a result decoded in the row decoder 20. In the case where unit pixels are arranged in a matrix form, the driving signals may be provided to pixels by each row. For example, the driving signal may be provided to the pixels, row by row. For example, the driving signals may be provided at the same time to the pixels in the same row.

The timing generator 50 may provide a timing signal and a control signal to the row decoder 20 and the column decoder 40.

The CDS 60 may receive the electrical signal generated by the APS array 10, and may hold and sample the electrical signal. The correlated double sampler (CDS) 60 may doubly sample a specific noise level and a signal level of the electric signal to output a difference level corresponding to a difference between the noise level and the signal level.

The ADC 70 may convert an analog signal corresponding to the difference level, which is output from the CDS 60, into a digital signal, and then output the digital signal.

The I/O buffer 80 may latch the digital signal, and the latched signal may sequentially output a digital signal to a video signal processing unit (not shown) in accordance with the decoding result from the column decoder 40.

Referring to FIG. 2, the image sensor according to some embodiments of the present disclosure may include a first region I, a second region II, a third region III, and a fourth region IV.

The first region I and the second region II may be sensor array regions. The second region II may surround the first region in a plane defined by a first horizontal direction DR1 and a second horizontal direction DR2 that is perpendicular to the first horizontal direction DR1.

The first region I may be an active pixel sensor region which includes active pixels for generating active signals corresponding to wavelengths of external light. The second region II may be an optical black sensor region for generating optical black signals by blocking the inflow of external light.

The fourth region IV may be a pad region in which a plurality of pads 180 are disposed. The plurality of pads 180 disposed in the fourth region IV may transmit and receive electrical signals to and from an external device. The fourth region IV may surround the second region II in a plane defined by the first horizontal direction DR1 and the second horizontal direction DR2.

Spatially relative terms, such as "beneath," "below," "lower," "above," "cupper" "horizontal," "vertical," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The third region III may be a connection region. The third region III may be electrically connected to a logic circuit region disposed on a lower surface 130a of a second substrate 130. The third region III may be disposed between the second region II that is an optical black sensor region and the fourth region IV that is a pad region.

Referring to FIGS. 3 to 9, the image sensor according to some embodiments of the present disclosure may include a first substrate 100, a first insulating layer 101, a second insulating layer 102, a gate structure 105, and a first wiring structure 110, a second wiring structure 120, the second substrate 130, first to fifth photoelectric conversion elements PD1 to PD5, first to ninth vertical gate structures VG1 to VG9, a floating diffusion region FD, first pixel separation patterns 135, second pixel separation patterns 140, a passivation layer 150, a first color filter 151, a second color filter 152, a grid pattern 155, microlenses 157, a protective layer 158, a transparent layer 159, first to third conductive patterns 161, 162, and 163, an adhesive layer 171, a low refractive index layer 172, a photoresist 173, and pads 180.

The first substrate 100 may be, for example, bulk silicon, or silicon-on-insulator (SOI). The first substrate 100 may be a silicon substrate, or formed of another material, for example, silicon germanium, indium antimonide, lead telluride compound, indium arsenide, indium phosphide, gallium arsenide, or gallium antimonide. Alternatively, the first substrate 100 may be a base substrate having an epitaxial layer formed thereon.

The first insulating layer 101 may be disposed on the first substrate 100. The first insulating layer 101 may be disposed to cover the gate structure 105 disposed on the first substrate 100. The first insulating layer 101 may include or be formed of at least one of, for example, silicon oxide ($SiO_2$), silicon nitride (SiN), silicon oxynitride (SiON), low-k dielectric material, or a combination thereof.

The first wiring structure 110 may be disposed on the first insulating layer 101. The first wiring structure 110 may include or be formed of a first interlayer insulating layer 112 and a plurality of first wiring layers 111 disposed in the first interlayer insulating layer 112.

The first wiring layer 111 may include or be formed of, for example, aluminum (Al), copper (Cu), tungsten (W), cobalt (Co), ruthenium (Ru), or the like, but the present disclosure is not limited thereto. The first interlayer insulating layer 112 may include or be formed of, for example, at least one of silicon oxide ($SiO_2$), silicon nitride (SiN), silicon oxynitride (SiON), a low-k dielectric material, or a combination thereof.

The second wiring structure 120 may be disposed on the first wiring structure 110. The second wiring structure 120 may include or be formed of a second interlayer insulating layer 122 and a plurality second wiring layers 121 disposed on/in the second interlayer insulating layer 122.

The second wiring layer 121 may include or be formed of, for example, aluminum (Al), copper (Cu), tungsten (W), cobalt (Co), ruthenium (Ru), or the like, but the present disclosure is not limited thereto. The second interlayer insulating layer 122 may include or be formed of, for example, at least one of silicon oxide ($SiO_2$), silicon nitride (SiN), silicon oxynitride (SiON), a low-k dielectric material, or a combination thereof.

The second insulating layer 102 may be disposed on the second wiring structure 120. The second insulating layer 102 may include or be formed of at least one of, for example, silicon oxide ($SiO_2$), silicon nitride (SiN), silicon oxynitride (SiON), low-k dielectric material, or a combination thereof.

The second substrate 130 may be disposed on the second insulating layer 102. The second substrate 130 may be, for example, bulk silicon, or SOI. The second substrate 130 may be a silicon substrate, or be formed of another material, for example, silicon germanium, indium antimonide, lead telluride compound, indium arsenide, indium phosphide, gallium arsenide, or gallium antimonide. Alternatively, the second substrate 130 may have an epitaxial layer formed on the base substrate. The second substrate 130 may include a first surface 130a in contact with the second insulating layer 102 and a second surface 130b opposite the first surface 130a.

For convenience of explanation, it is defined that the second substrate 130 includes the first region I in which the APS region is formed, the second region II in which the optical black sensor region is formed, the third region III in which a connection region is formed, and the fourth region IV in which a pad region is formed.

A plurality of photoelectric conversion elements may be disposed in the second substrate 130. For example, the first to fourth photoelectric conversion elements PD1, PD2, PD3, and PD4 may be disposed in the first region I of the second substrate 130. The first to fourth photoelectric conversion elements PD1, PD2, PD3, and PD4 may be disposed to be spaced apart from each other in the first horizontal direction DR1 and/or the second horizontal direction DR2. The fifth photoelectric conversion element PD5 may be disposed in the second region II of the second substrate 130. The first to fifth photoelectric conversion elements PD1, PD2, PD3, PD4, and PD5 may each be a photodiode, but the present disclosure is not limited thereto.

The first pixel separation patterns 135 may be respectively disposed between the first to fifth photoelectric conversion elements PD1, PD2, PD3, PD4, and PD5. For example, a pair of first pixel separation patterns 135 may be disposed between each pair of adjacent photoelectric conversion elements among the first to fifth photoelectric conversion elements PD1, PD2, PD3, PD4, and PD5. The first pixel separation pattern 135 may surround each of the first to fifth photoelectric conversion elements PD1, PD2, PD3, PD4, and PD5. The first pixel separation pattern 135 may extend in a vertical direction DR3 from the first surface 130a of the second substrate 130 into the second substrate 130. Here, the vertical direction DR3 may be defined as a direction perpendicular to each of the first horizontal direction DR1 and the second horizontal direction DR2.

For example, the surface of the first pixel separation pattern 135 exposed on the first surface 130a of the second substrate 130 may be formed on the same plane as the first surface 130a of the second substrate 130. The first pixel separation pattern 135 may include or be formed of at least one of, for example, silicon oxide (SiO₂), silicon nitride (SiN), silicon carbide (SiC), silicon oxycarbide (SiOC), silicon oxynitride (SiON), and silicon oxycarbonitride (SiOCN)

The second pixel separation patterns 140 may be respectively disposed between the first to fifth photoelectric conversion elements PD1, PD2, PD3, PD4, and PD5. For example, a second pixel separation pattern 140 may be disposed between each pair of adjacent photoelectric conversion elements among the first to fifth photoelectric conversion elements PD1, PD2, PD3, PD4, and PD5. The second pixel separation pattern 140 may surround each of the first to fifth photoelectric conversion elements PD1, PD2, PD3, PD4, and PD5. The first pixel separation pattern 135 may surround at least a part of the second pixel separation pattern 140. For example, a pair of the first pixel separation patterns 135 may be formed on both sides of each second pixel separation pattern 140. For example, a width of the second pixel separation pattern 140 in the first horizontal direction DR1 may be greater than a width of the first pixel separation pattern 135 in the first horizontal direction DR1.

The second pixel separation pattern 140 may extend in the vertical direction DR3 (e.g., upwardly) from the first surface 130a of the second substrate 130 into the second substrate 130. For example, the second pixel separation pattern 140 may extend to the second surface 130b of the second substrate 130. For example, the surface of the second pixel separation pattern 140 exposed on the first surface 130a of the second substrate 130 may be formed on the same plane as the first surface 130a of the second substrate 130. In addition, the surface of the second pixel separation pattern 140 exposed on the second surface 130b of the second substrate 130 may be formed on the same plane as the second surface 130b of the second substrate 130. The first to fifth photoelectric conversion elements PD1, PD2, PD3, PD4, and PD5 may be separated from each other by the first pixel separation patterns 135 and the second pixel separation patterns 140.

The first and second pixel separation patterns 135 and 140 may define a plurality of pixel regions separated from each other in the second substrate 130. For example, as shown in FIG. 6, the first and second pixel separation patterns 135 and 140 may define first to fifth pixel regions PX1, PX2, PX3, and PX4 separated from each other in the second substrate 130. For example, the second pixel region PX2 may be spaced apart from the first pixel region PX1 in the first horizontal direction DR1. The third pixel region PX3 may be spaced apart from the first pixel region PX1 in the second horizontal direction DR2. The fourth pixel region PX4 may be spaced apart from the third pixel region PX3 in the first horizontal direction DR1. In addition, the fourth pixel region PX4 may be spaced apart from the second pixel region PX2 in the second horizontal direction DR2.

For example, the first photoelectric conversion element PD1 may be disposed in the first pixel region PX1. The second photoelectric conversion element PD2 may be disposed in the second pixel region PX2. The third photoelectric conversion element PD3 may be disposed in the third pixel region PX3. The fourth photoelectric conversion element PD4 may be disposed in the fourth pixel region PX4.

The second pixel separation pattern 140 may include barrier layers 141 and a filling layer 142. The barrier layer 141 may form a sidewall of the second pixel separation pattern 140. For example, side surfaces of the second pixel separation pattern 140 may be formed of side surfaces of the barrier layers 141 on opposite sides of the second pixel separation pattern 140. For example, the barrier layer 141 may include or be formed of a high-k insulating material. However, the present disclosure is not limited thereto.

The filling layer 142 may be disposed between the barrier layers 141. For example, the barrier layer 141 may extend in the vertical direction DR3 from the first surface 130a of the second substrate 130 to the second surface 130b of the second substrate 130. The filling layer 142 may include or be formed of a material with excellent gap-fill performance, such as polysilicon (Poly-Si). However, the present disclosure is not limited thereto.

The floating diffusion region FD may be disposed in the second substrate 130. For example, the floating diffusion region FD may be disposed over each of the first to fourth pixel regions PX1, PX2, PX3, and PX4. For example, the floating diffusion region FD may be disposed on edges of the respective first to fourth pixel regions PX1, PX2, PX3, and PX4. For example, the floating diffusion region FD may overlap each of the first to fourth photoelectric elements PD1, PD2, PD3, and PD4 in the vertical direction DR3.

For example, as shown in FIG. 9, an upper surface of the floating diffusion region FD may be formed on the same plane as the first surface 130a of the second substrate 130. For example, the floating diffusion region FD may be formed by doping the second substrate 130, which is of p-type, with n-type impurities. For example, the second substrate 130 may be a p-type substrate and the floating diffusion region FD may be an n-type region. For example, as shown in FIG. 8, the floating diffusion region FD may not overlap each of the first and second pixel separation patterns 135 and 140 in the vertical direction DR3. For example, the first and second pixel separation patterns 135 and 140 may not be disposed in a portion where the floating diffusion region FD is disposed. However, the present disclosure is not limited thereto.

For example, the first to eighth vertical gate structures VG1 to VG8 may be disposed in the first region I of the second substrate 130. The ninth vertical gate structure VG9 may be disposed in the second region II of the second substrate 130. The first to ninth vertical gate structures VG1 to VG9 may be, for example, a gate of a charge transfer element, a gate of a reset element, a gate of a drive element, and the like.

The first vertical gate structure VG1 may be disposed in the first pixel region PX1. The first vertical gate structure VG1 may extend from the first surface 130a of the second substrate 130 into the second substrate 130. The first vertical gate structure VG1 may include a first portion VG1_1 disposed in the second substrate 130 and a second portion VG1_2 disposed on the first surface 130a of the second substrate 130.

A width of the first portion VG1_1 of the first vertical gate structure VG1 in the first horizontal direction DR1 may gradually decrease in a horizontal direction approaching the floating diffusion region FD. For example, the width of the first portion VG1_1 of the first vertical gate structure VG1 in the first horizontal direction DR1 may decrease from a second width W2 to a first width W1 in the horizontal direction approaching the floating diffusion region FD as shown in FIG. 7.

For example, a planar shape (e.g., a shape in a plan view) of the first portion VG1_1 of the first vertical gate structure VG1 may be a triangular shape. Here, the planar shape may be a shape in a plane defined by (e.g., parallel to) the first horizontal direction DR1 and the second horizontal direction DR2 (e.g., in a horizontal plane). For example, one sidewall of the first portion VG1_1 of the first vertical gate structure VG1 may be arranged along a sidewall of the first pixel separation pattern 135 disposed between the first pixel region PX1 and the second pixel region PX2, but the present disclosure is not limited thereto. For example, one sidewall of the first portion VG1_1 of the first vertical gate structure VG1 may extend parallel with a sidewall of the first pixel separation pattern 135 disposed between the first pixel region PX1 and the second pixel region PX2. For example, one sidewall of the first portion VG1_1 of the first vertical gate structure VG1 may contact a sidewall of the first pixel separation pattern 135 disposed between the first pixel region PX1 and the second pixel region PX2. For example, a first angle θ 1 between two sidewalls of the first portion VG1_1 of the first vertical gate structure VG1 adjacent to the floating diffusion region FD may be greater than or equal to 30 degrees and less than 45 degrees. For example, the first angle θ 1 may be measured on a horizontal plane and the first angle θ 1 may be formed at the closest vertex of a triangle formed by the sidewalls of the first portion VG1_1 of the first vertical gate structure VG1 on the horizontal plane, e.g., in a plan view. For example, both sides forming the first angle θ 1 may contact/meet the floating diffusion region FD, e.g., in the plan view.

The second portion VG1_2 of the first vertical gate structure VG1 may be disposed on the first portion VG1_1 of the first vertical gate structure VG1. For example, a planar shape (e.g., a shape in a plan view) of the second portion VG1_2 of the first vertical gate structure VG1 may be a triangular shape. For example, a width of the second portion VG1_2 of the first vertical gate structure VG1 in the first horizontal direction DR1 may be greater than the width of the first portion VG1_1 of the first vertical gate structure VG1 in the first horizontal direction DR1.

The second vertical gate structure VG2 may be disposed in the first pixel region PX1. The second vertical gate structure VG2 may be disposed directly adjacent to the first vertical gate structure VG1 in the first pixel region PX1. Here, when the second vertical gate structure VG2 is disposed directly adjacent to the first vertical gate structure VG1, there are no intervening vertical gate structures present. For example, two vertical gate structures directly adjacent may be the closest vertical gate structures to each other.

The second vertical gate structure VG2 may extend from the first surface 130a of the second substrate 130 into the second substrate 130. The second vertical gate structure VG2 may include a first portion VG2_1 disposed in the second substrate 130 and a second portion VG2_2 disposed on the first surface 130a of the second substrate 130.

A width of the first portion VG2_1 of the second vertical gate structure VG2 in the second horizontal direction DR2 may gradually decrease in a horizontal direction approaching the floating diffusion region FD. For example, a planar shape (e.g., a shape in a plan view) of the first portion VG2_1 of the second vertical gate structure VG2 may be a triangular shape. For example, one sidewall of the first portion VG2_1 of the second vertical gate structure VG2 may be arranged along a sidewall of the first pixel separation pattern 135 disposed between the first pixel region PX1 and the third pixel region PX3, but the present disclosure is not limited thereto. For example, one sidewall of the first portion VG2_1 of the second vertical gate structure VG2 may extend parallel with a sidewall of the first pixel separation pattern 135 disposed between the first pixel region PX1 and the third pixel region PX3. For example, one sidewall of the first portion VG1_1 of the second vertical gate structure VG2 may contact a sidewall of the first pixel separation pattern 135 disposed between the first pixel region PX1 and the third pixel region PX3. For example, a second angle θ 2 between two sidewalls of the first portion VG2_1 of the second vertical gate structure VG2 adjacent to the floating diffusion region FD may be greater than or equal to 30 degrees and less than 45 degrees. For example, the second angle θ 2 may be measured on a horizontal plane and the second angle θ 2 may be formed at the closest vertex of a triangle formed by the sidewalls of the first portion VG2_1 of the second vertical gate structure VG2 on the horizontal plane, e.g., in a plan view. For example, both sides forming the second angle θ 2 may contact/meet the floating diffusion region FD, e.g., in the plan view.

The second portion VG2_2 of the second vertical gate structure VG2 may be disposed on the first portion VG2_1 of the second vertical gate structure VG2. For example, a planar shape (e.g., a shape in a plan view) of the second portion VG2_2 of the second vertical gate structure VG2 may be a triangular shape. For example, a width of the second portion VG2_2 of the second vertical gate structure VG2 in the second horizontal direction DR2 may be greater than the width of the first portion VG2_1 of the second vertical gate structure VG2 in the second horizontal direction DR2.

The first portion VG1_1 of the first vertical gate structure VG1 may include a first sidewall VG1_1s facing the first portion VG2_1 of the second vertical gate structure VG2. The first portion VG2_1 of the second vertical gate structure VG2 may include a second sidewall VG2_1s facing the first portion VG1_1 of the first vertical gate structure VG1. Spacing/distances between the first portion VG1_1 of the first vertical gate structure VG1 and the first portion VG2_1 of the second vertical gate structure VG2 may decrease in a direction (e.g., a diagonal direction of the first pixel PX1 in a plan view) approaching the floating diffusion region FD. For example, distances between the first portion VG1_1 of the first vertical gate structure VG1 and the first portion VG2_1 of the second vertical gate structure VG2 may increase in a direction receding from the floating diffusion region FD. For example, spacing/distances between the first sidewall VG1_1s and the second sidewall VG2_1s may decrease from a second distance/spacing P2 to a first distance/spacing P1 in a direction approaching the floating diffusion region FD as shown in FIG. 7.

Each of the third and fourth vertical gate structures VG3 and VG4 may be disposed in the second pixel region PX2. Each of the third and fourth vertical gate structures VG3 and VG4 may have a similar structure to or the same structure as that of each of the first and second vertical gate structures VG1 and VG2. For example, the third vertical gate structure VG3 may be identical to the second vertical gate structure VG2 and the fourth vertical gate structure VG4 may be identical to the first vertical gate structure VG1. The third and fourth vertical gate structures VG3 and VG4 may be disposed symmetrically to the first and second vertical gate structures VG1 and VG2, respectively, with respect to the first and second pixel separation patterns 135 and 140 disposed between the first pixel region PX1 and the second pixel region PX2. For example, the third and fourth vertical gate structures VG3 and VG4 may have a mirror image symmetry with respect to the first and second vertical gate structures VG1 and VG2 respectively.

The third vertical gate structure VG3 may include a first portion VG3_1 disposed in the second substrate 130 and a second portion VG3_2 disposed on the first surface 130a of the second substrate 130 and on the first portion VG3_1. The fourth vertical gate structure VG4 may include a first portion VG4_1 disposed in the second substrate 130 and a second portion VG4_2 disposed on the first surface 130a of the second substrate 130 and on the first portion VG4_1.

The first portion VG3_1 of the third vertical gate structure VG3 may include a third sidewall VG3_1s facing the first portion VG4_1 of the fourth vertical gate structure VG4. The first portion VG4_1 of the fourth vertical gate structure VG4 may include a fourth sidewall VG4_1s facing the first portion VG3_1 of the third vertical gate structure VG3. Spacing/distances between the third sidewall VG3_1s and the fourth sidewall VG4_1s may decrease in a direction approaching the floating diffusion region FD. For example, distances between the third sidewall VG3_1s and the fourth sidewall VG4_1s may increase in a direction receding from the floating diffusion region FD.

Each of the fifth and sixth vertical gate structures VG5 and VG6 may be disposed in the third pixel region PX3. Each of the fifth and sixth vertical gate structures VG5 and VG6 may have a similar structure to or the same structure as that of each of the first and second vertical gate structures VG1 and VG2. For example, the fifth vertical gate structure VG5 may be identical to the first vertical gate structure VG1 and the sixth vertical gate structure VG6 may be identical to the second vertical gate structure VG2. The fifth and sixth vertical gate structures VG5 and VG6 may be disposed symmetrically to the first and second vertical gate structures VG1 and VG2, respectively, with respect to the first and second pixel separation patterns 135 and 140 disposed between the first pixel region PX1 and the third pixel region PX3. For example, the fifth vertical gate structure VG5 may have a mirror image symmetry with respect to the second vertical gate structure VG2, and the sixth vertical gate structure VG6 may have a mirror image symmetry with respect to the first vertical gate structure VG1 as shown in FIGS. 6 and 7.

The fifth vertical gate structure VG5 may include a first portion VG5_1 disposed in the second substrate 130 and a second portion VG5_2 disposed on the first surface 130a of the second substrate 130 and on the first portion VG5_1. The sixth vertical gate structure VG6 may include a first portion VG6_1 disposed in the second substrate 130 and a second portion VG6_2 disposed on the first surface 130a of the second substrate 130 and on the first portion VG6_1.

The first portion VG5_1 of the fifth vertical gate structure VG5 may include a fifth sidewall VG5_1s facing the first portion VG6_1 of the sixth vertical gate structure VG6. The first portion VG6_1 of the sixth vertical gate structure VG6 may include a sixth sidewall VG6_1s facing the first portion VG5_1 of the fifth vertical gate structure VG5. Spacing/distances between the fifth sidewall VG5_1s and the sixth sidewall VG6_1s may decrease in a direction approaching the floating diffusion region FD as shown in FIGS. 6 and 7. For example, distances between the fifth sidewall VG5_1s and the sixth sidewall VG6_1s may increase in a direction receding from the floating diffusion region FD.

Each of the seventh and eighth vertical gate structures VG7 and VG8 may be disposed in the fourth pixel region PX4. Each of the seventh and eighth vertical gate structures VG7 and VG8 may have a similar structure to or the same structure as that of each of the first and second vertical gate structures VG1 and VG2. For example, the seventh vertical gate structure VG7 may be identical to the second vertical gate structure VG2 and the eighth vertical gate structure VG8 may be identical to the first vertical gate structure VG1. The seventh and eighth vertical gate structures VG7 and VG8 may be disposed symmetrically to the fifth and sixth vertical gate structures VG5 and VG6, respectively, with respect to the first and second pixel separation patterns 135 and 140 disposed between the third pixel region PX3 and the fourth pixel region PX4. For example, the seventh vertical gate structure VG7 may have a mirror image symmetry with respect to the fifth vertical gate structure VG5, and the eighth vertical gate structure VG8 may have a mirror image symmetry with respect to the sixth vertical gate structure VG6 as shown in FIGS. 6 and 7.

The seventh vertical gate structure VG7 may include a first portion VG7_1 disposed in the second substrate 130 and a second portion VG7_2 disposed on the first surface 130a of the second substrate 130 and on the first portion VG7_1. The eighth vertical gate structure VG8 may include a first portion VG8_1 disposed in the second substrate 130 and a second portion VG8_2 disposed on the first surface 130a of the second substrate 130 and on the first portion VG8_1.

The first portion VG7_1 of the seventh vertical gate structure VG7 may include a seventh sidewall VG7_1s facing the first portion VG8_1 of the eighth vertical gate structure VG8. The first portion VG8_1 of the eighth vertical gate structure VG8 may include an eighth sidewall VG8_1s facing the first portion VG7_1 of the seventh vertical gate structure VG7. Spacing/distances between the seventh sidewall VG7_1s and the eighth sidewall VG8_1s may decrease in a direction approaching the floating diffusion region FD as shown in FIGS. 6 and 7. For example, distances between the seventh sidewall VG7_1s and the eighth sidewall VG8_1s may increase in a direction receding from the floating diffusion region FD.

Each of the first to ninth vertical gate structures VG1 to VG9 may include agate insulating layer 192 and a gate electrode 191. The gate insulating layer 192 may be disposed on a portion where each of the first to ninth vertical gate structures VG1 to VG9 is in contact with the second substrate 130. The gate insulating layer 192 may include or be formed of, for example, at least one of silicon oxide, silicon oxynitride, silicon nitride, or a high-k dielectric material having a dielectric constant greater than that of silicon oxide.

The gate electrode 191 may be disposed on the gate insulating layer 192 in the second substrate and on the first surface 130a of the second substrate 130. The gate electrode 191 may include or be formed of at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

Agate spacer 193 may be disposed on the first surface 130a of the second substrate 130 along a sidewall of each of the gate electrode 191 and the gate insulating layer 192. The gate spacer 193 may include or be formed of at least one of, for example, silicon nitride (SiN), silicon oxynitride (SiON), silicon carbonitride (SiCN), silicon oxycarbonitride (SiOCN), silicon boron nitride (SiBN), silicon oxyboronnitride (SiOBN), silicon oxycarbide (SiOC), or a combination thereof. Although not illustrated in FIGS. 8 and 9, a capping pattern including or formed of an insulating material may be disposed on the gate electrode 191.

The passivation layer 150 may be disposed on the second surface 130b of the second substrate 130. The passivation layer 150 may include or be formed of, for example, a high-k insulating material. The passivation layer 150 may include an amorphous crystalline structure. For example, at least part of the high-k insulating material included in the passivation layer 150 may have an amorphous crystalline structure. In certain embodiments, the passivation layer 150 may have an amorphous crystalline structure throughout the passivation layer 150. However, the present disclosure is not limited thereto.

Although FIGS. 3 to 5 illustrates that the passivation layer 150 is formed as a single layer, the present disclosure is not limited thereto. In some other embodiments, the passivation layer 150 may further include a planarization layer and an anti-reflection layer. In this case, the planarization layer may include or be formed of at least one of, for example, a silicon oxide film-based material, a silicon nitride film-based material, resin, or a combination thereof. The anti-reflection layer may include or be formed of a high-k dielectric material, for example, hafnium oxide (HfO$_2$), but the present disclosure is not limited thereto.

The first color filter 151 may be disposed on the first region I of the second substrate 130 that is an APS region. The first color filter 151 may not be disposed on the second region II of the second substrate 130 that is an optical black sensor region.

The first color filter 151 may be disposed on the passivation layer 150. A first color filter 151 may be arranged to correspond to each unit pixel. For example, a plurality of first color filters 151 may be arranged two-dimensionally (e.g., in a matrix form) on a plane defined by and/or extending in the first horizontal direction DR1 and the second horizontal direction DR2.

The first color filter 151 may include or may be a red color filter, a green color filter, or a blue color filter depending on a unit pixel. For example, each unit pixel may include a first color filter 151. In certain embodiments, the first color filters 151 may include a yellow filter, a magenta filter, and a cyan filter, or may further include a white filter.

The grid pattern 155 may be formed in a grid form on the second surface 130b of the second substrate 130 and disposed to surround each unit pixel, e.g., in a plan view. For example, the grid pattern 155 may be disposed between the first color filters 151 on the passivation layer 150. The grid pattern 155 may reflect incident light obliquely incident on the second substrate 130 to provide more incident light to each of the first to fourth photoelectric conversion elements PD1 to PD4.

The microlenses 157 may be disposed on the first region I of the second substrate 130 that is an APS region. The microlenses 157 may not be disposed on the second region II of the second substrate 130 that is an optical black sensor region.

The microlenses 157 may be disposed on the first color filter 151. The microlenses 157 may be arranged to correspond to respective unit pixels. For example, one microlens 157 may be disposed on one first color filter 151. However, the present disclosure is not limited thereto. The microlenses 157 may be arranged two-dimensionally (e.g., in a matrix form) on a plane defined by and/or extending in the first horizontal direction DR1 and the second horizontal direction DR2.

The microlens 157 may have a convex shape and may have a predetermined radius of curvature. Accordingly, the microlenses 157 may condense incident light into the first to fourth photoelectric conversion elements PD1 to PD4. The microlenses 157 may include or be formed of, for example, an organic material such as a light-transmitting resin, or an inorganic material, but the present disclosure is not limited thereto.

The first conductive pattern 161 may be disposed on the second region II of the second substrate 130 that is an optical black sensor region. The first conductive pattern 161 may be disposed on the passivation layer 150.

The first conductive pattern 161 may include or be formed of metal. For example, the first conductive pattern 161 may include or be formed of at least one of titanium (Ti) or tungsten (W), but the present disclosure is not limited thereto.

A connection trench CT may be formed in the third region III of the second substrate 130 that is a connection region. The connection trench CT may penetrate the passivation layer 150, the second substrate 130, the second insulating layer 102, and the second wiring structure 120 in the vertical direction DR3. The connection trench CT may extend into the first wiring structure 110. The connection trench CT may expose at least a portion of the first wiring layer 111. The connection trench CT may expose at least a portion of the second wiring layer 121. For example, the connection trench may extend in the third direction DR3 from the passivation layer 150 (e.g., from an upper surface of the passivation layer 150) to the first wiring structure 110. A lower surface of the connection trench CT may be stepped. For example, the lowermost part of the connection trench CT may have a width in the first direction DR1 less than a width of an upper part of the connection trench CT in the first direction DR1 such that a step structure is formed between the lower most part and the upper part of the connection trench CT. For example, the step (structure) may be formed in the second wiring structure 120.

The second conductive pattern 162 may be disposed along a sidewall and a bottom surface of the connection trench CT. For example, the second conductive pattern 162 may be conformally formed, e.g., on the top surface of the passivation layer 150 and on the sidewall and the bottom surface of the connection trench CT. For example, at least a portion of the second conductive pattern 162 may extend, e.g., in the first direction DR1, on the upper surface of the passivation layer 150. The second conductive pattern 162 may include or be formed of metal. For example, the second conductive pattern 162 may include or be formed of at least one of titanium (Ti) or tungsten (W), but the present disclosure is not limited thereto.

A pad trench PT may be formed in the fourth region IV of the second substrate 130 that is a pad region. The pad trench PT may penetrate the passivation layer 150 in the vertical direction DR3, extending into the second substrate 130. For example, the pad trench PT may extend in the third direction DR3 from the passivation layer 150 (e.g., from a top surface of the passivation layer 150) to the second substrate 130. The third conductive pattern 163 may be disposed along a sidewall and a bottom surface of the pad trench PT. For example, the third conductive pattern 163 may be conformally formed, e.g., on the top surface of the passivation layer 150 and the sidewall and the bottom surface of the pad trench PT. For example, at least a portion of the third conductive pattern 163 may extend, e.g., in the first direction DR1 on the upper surface of the passivation layer 150. The third conductive pattern 163 may include or be formed of metal. For example, the third conductive pattern 163 may include or be formed of at least one of titanium (Ti) or tungsten (W), but the present disclosure is not limited thereto.

The pad 180 may fill the pad trench PT on the third conductive pattern 163. The pad 180 may include or be formed of a conductive material.

The adhesive layer 171 may be disposed on the passivation layer 150. The adhesive layer 171 may be disposed on the passivation layer 150 to cover the first conductive pattern 161 and the second conductive pattern 162. Also, the adhesive layer 171 may be disposed to cover the third conductive pattern 163 that extends on the passivation layer 150.

The adhesive layer 171 may be disposed on the second conductive pattern 162 in the connection trench CT. The adhesive layer 171 may be conformally formed in the connection trench CT, e.g., on the second conductive pattern 162. However, the present disclosure is not limited thereto. The adhesive layer 171 may include or be formed of, for example, aluminum oxide (Al2O3), but the present disclosure is not limited thereto.

The low refractive index layer 172 may be disposed on the adhesive layer 171 in the connection trench CT. The low refractive index layer 172 may fill the connection trench CT. The low refractive index layer 172 may include or be formed of at least one of, for example, oxide, nitride, or oxynitride. However, the present disclosure is not limited thereto.

The photoresist 173 may be disposed on the low refractive index layer 172. A portion of the photoresist 173 may be disposed to protrude from an upper surface of the adhesive layer 171. However, the present disclosure is not limited thereto. In some other embodiments, the photoresist 173 may be omitted.

The second color filter 152 may be disposed on the second region II of the second substrate 130 that is an optical black sensor region and the third region III of the second substrate 130 that is a connection region. The second color filter 152 may be disposed on the adhesive layer 171. The second color filter 152 is not disposed on the fourth region IV of the second substrate 130 that is a pad region.

The second color filter 152 may be in contact with, for example, the upper surface of the adhesive layer 171. For example, an upper surface of the second color filter 152 may be formed to be higher than an upper surface of the first color filter 151. However, the present disclosure is not limited thereto. The second color filter 152 may include or may be, for example, a blue color filter.

The transparent layer 159 may be disposed on the adhesive layer 171 and the second color filter 152. For example, the transparent layer 159 may be disposed to completely cover the second color filter 152. However, the present disclosure is not limited thereto. The transparent layer 159 is not disposed on the pad 180. The transparent layer 159 may include or be formed of, for example, a material that transmits light.

The protective layer 158 may be disposed on the microlenses 157 and the transparent layer 159. For example, the protective layer 158 may be conformally formed on the microlenses 157 and the transparent layer 159. For example, the protective layer 158 may include or be formed of an inorganic oxide film. The protective layer 158 may be include or be formed of at least one of, for example, silicon oxide, titanium oxide, zirconium oxide, hafnium oxide, or a combination thereof, but the present disclosure is not limited thereto.

The image sensor according to some embodiments of the present disclosure may include two vertical gate structures disposed in each unit pixel and the vertical gate structures are disposed such that spacing/distances, e.g., in a horizontal direction, between the two vertical gate structures decrease in a direction approaching the floating diffusion region FD, e.g., in a horizontal direction from an end opposite the floating diffusion region FD with respect to the pixel. Accordingly, transmission characteristics of the vertical gate structures can be improved.

Hereinafter, an image sensor according to some other embodiments of the present disclosure will be described with reference to FIG. 10. The following description will focus on differences from the image sensor shown in FIGS. 1 to 9. For example, elements not mentioned below may be the same as any compatible/corresponding elements previously described.

Figure 10:
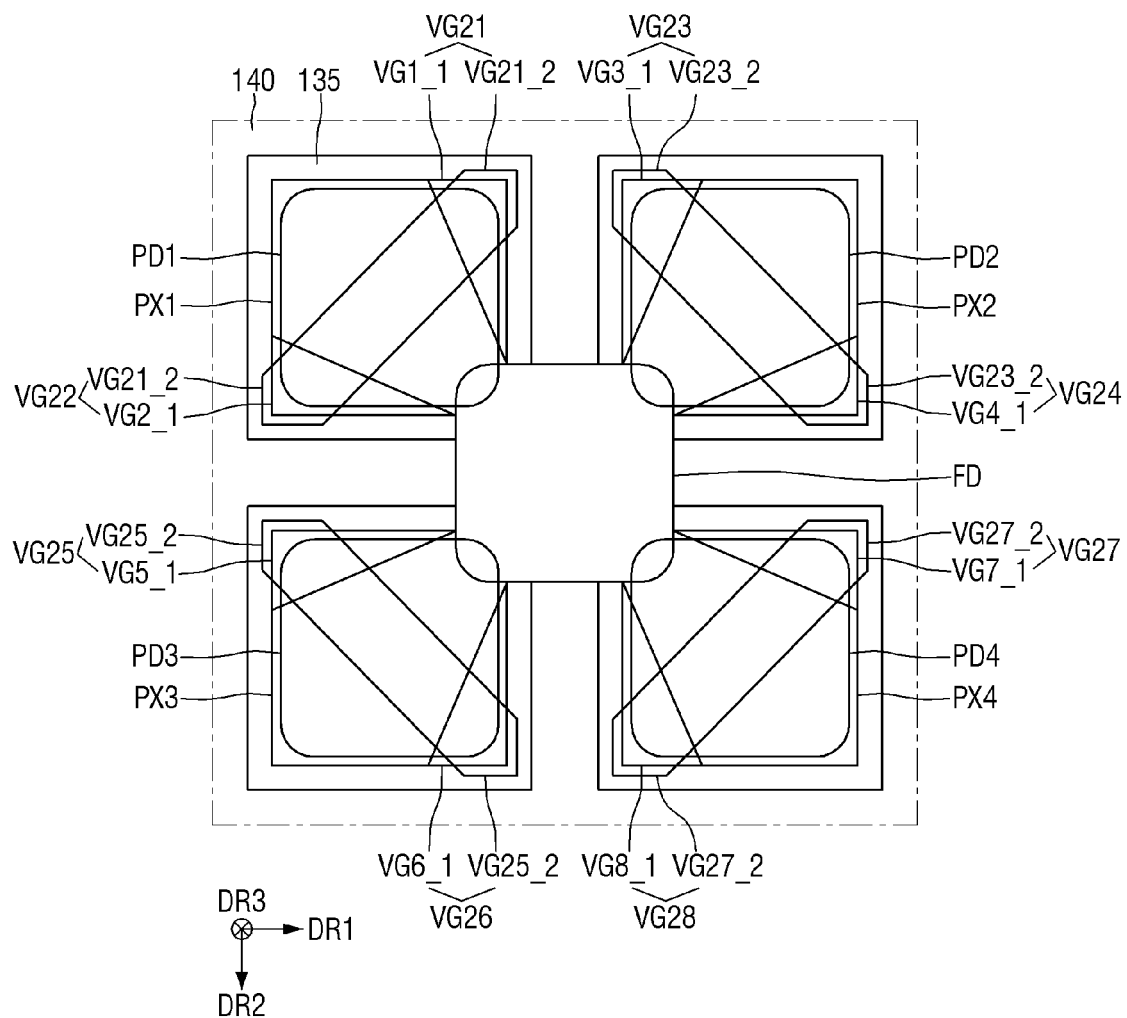
FIG. 10 is a plan view illustrating a vertical gate structure of an image sensor according to some other embodiments of the present disclosure.

FIG. 10 is a plan view illustrating a vertical gate structure of an image sensor according to some other embodiments of the present disclosure.

Referring to FIG. 10, in an image sensor according to some other embodiments of the present disclosure, a first vertical gate structure VG21 and a second vertical gate structure VG22 may be directly connected to each other, a third vertical gate structure VG23 and a fourth vertical gate structure VG24 may be directly connected to each other, a fifth vertical gate structure VG25 and a sixth vertical gate structure VG26 may be directly connected to each other, and a seventh vertical gate structure VG27 and an eighth vertical gate structure VG28 may be directly connected to each other.

For example, second portions VG21_2 of the first and second vertical gate structures VG21 and VG22 may be integrally formed, e.g., as one body, in a first pixel region PX1. For example, the first and second vertical gate structures VG21 and VG22 may be integrally formed as one body. In a second pixel region PX2, second portions VG23_2 of the third and fourth vertical gate structures VG23 and VG24 may be integrally formed, e.g., as one body. For example, the third and fourth vertical gate structures VG23 and VG24 may be integrally formed as one body. In a third pixel region PX3, second portions VG25_2 of the fifth and sixth vertical gate structures VG25 and VG26 may be integrally formed, e.g., as one body. For example, the fifth and sixth vertical gate structures VG25 and VG26 may be integrally formed as one body. In a fourth pixel region PX4, second portions VG27_2 of the seventh and eighth vertical gate structures VG27 and VG28 may be integrally formed, e.g., as one body. For example, the seventh and eighth vertical gate structures VG27 and VG28 may be integrally formed as one body.

For example, the second portions VG23_2 of the third and fourth vertical gate structures VG23 and VG24 may be disposed symmetrically to the second portions VG21_2 of the first and second vertical gate structures VG21 and VG22 with respect to a second pixel separation pattern 140 disposed between the first pixel region PX1 and the second pixel region PX2. The second portions VG25_2 of the fifth and sixth vertical gate structures VG25 and VG26 may be disposed symmetrically to the second portions VG21_2 of the first and second vertical gate structures VG21 and VG22 with respect to the second pixel separation pattern 140 disposed between the first pixel region PX1 and the third pixel region PX3. The second portions VG27_2 of the seventh and eighth vertical gate structures VG27 and VG28 may be disposed symmetrically to the second portions VG25_2 of the fifth and sixth vertical gate structures VG25 and VG26 with respect to the second pixel separation pattern 140 disposed between the third pixel region PX3 and the fourth pixel region PX4.

Hereinafter, an image sensor according to some other embodiments of the present disclosure will be described with reference to FIGS. 11 to 13. The following description will focus on differences from the image sensor shown in FIGS. 1 to 9. For example, elements not mentioned below may be the same as any compatible/corresponding elements previously described.

Figure 11:
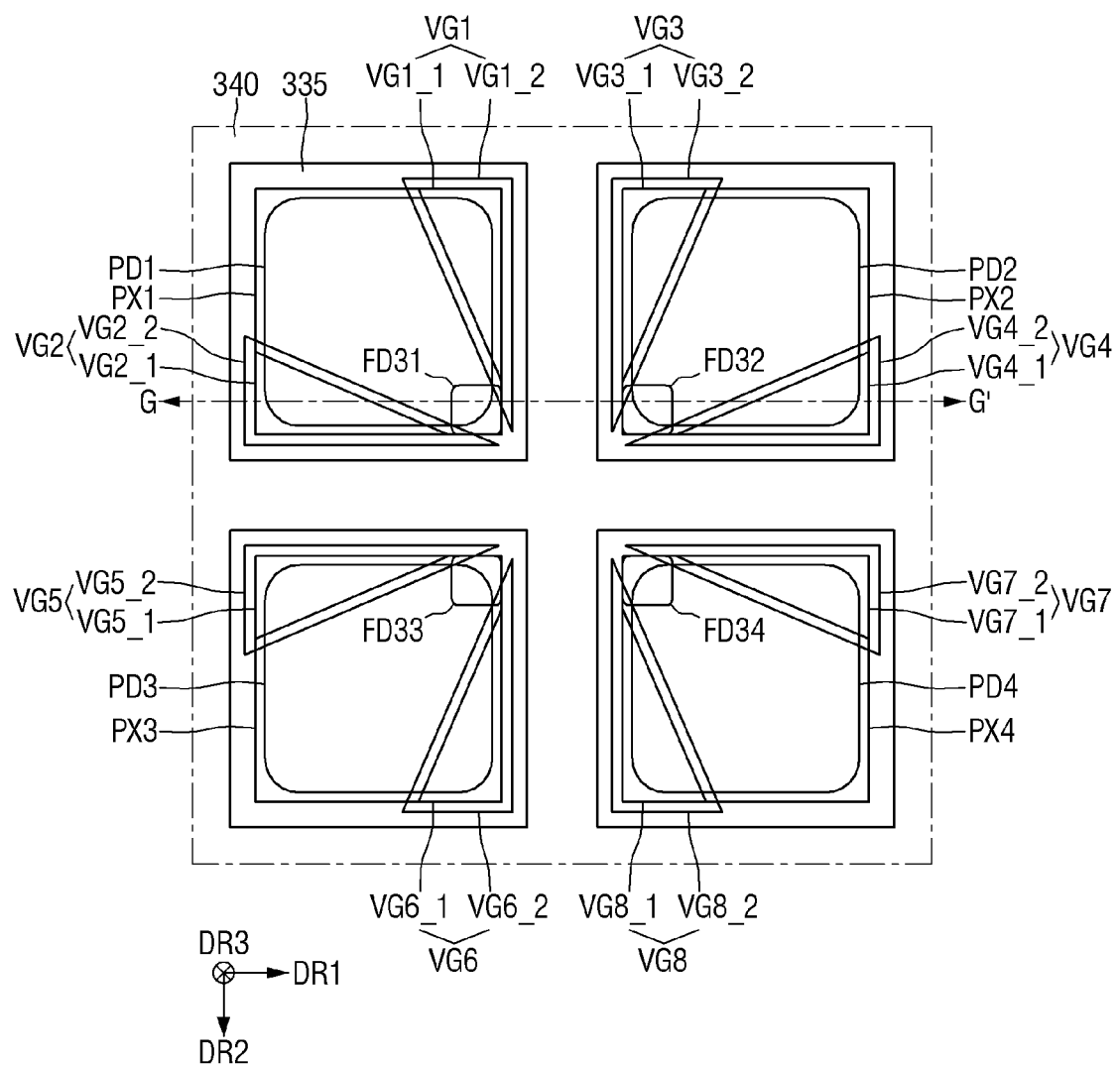
FIGS. 11 and 12 are plan views illustrating a vertical gate structure of an image sensor according to some other embodiments of the present disclosure.
Figure 12:
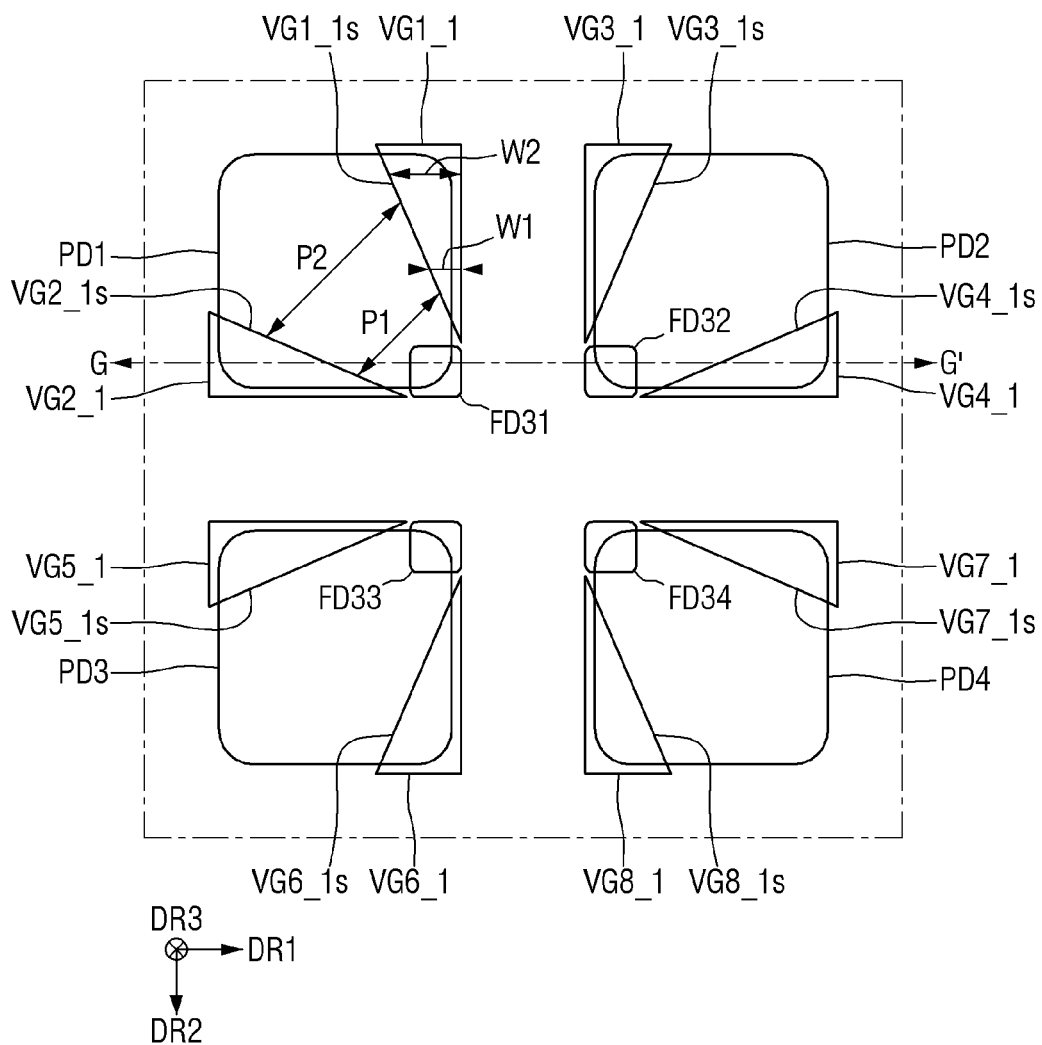

FIGS. 11 and 12 are plan views illustrating a vertical gate structure of an image sensor according to some other embodiments of the present disclosure. FIG. 13 is a cross-sectional view taken along line G-G' of each of FIGS. 11 and 12.

Figure 13:
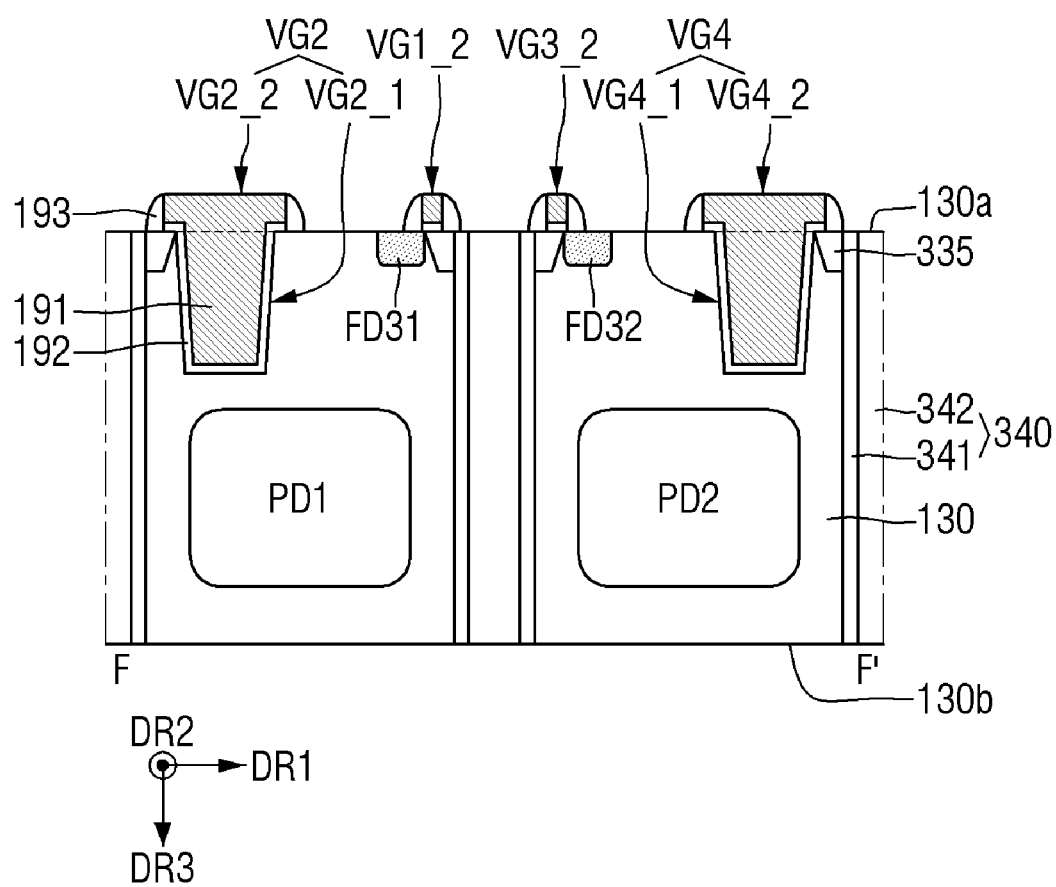
FIG. 13 is a cross-sectional view taken along line G-G' of each of FIGS. 11 and 12.

Referring to FIGS. 11 to 13, in an image sensor according to some other embodiments of the present disclosure, individual floating diffusion regions FD31 to FD34 may be disposed in first to fourth pixel regions PX1 to PX4, respectively.

For example, the first floating diffusion region FD31 may be disposed between a first vertical gate structure VG1 and a second vertical gate structure VG2 at an edge of the first pixel region PX1. At an edge of the second pixel region PX2, the second floating diffusion region FD32 may be disposed between a third vertical gate structure VG3 and a fourth vertical gate structure VG4. At an edge of the third pixel region PX3, the third floating diffusion region FD33 may be disposed between a fifth vertical gate structure VG5 and a sixth vertical gate structure VG6. At an edge of the fourth pixel region PX4, the fourth floating diffusion region FD34 may be disposed between a seventh vertical gate structure VG7 and an eighth vertical gate structure VG8.

The first to fourth floating diffusion regions FD31 to FD34 may be spaced apart from each other in the first horizontal direction DR1 and/or the second horizontal direction DR2. Each pair of the first to fourth floating diffusion regions FD31 to FD34 may be disposed symmetrically to each other with respect to a second pixel separation pattern 340, e.g., disposed between the corresponding pair of the floating diffusion regions FD31 to FD34 and/or pixel regions PX1 to PX4. The first to fourth pixel regions PX1 to PX4 may be completely separated from each other by first pixel separation patterns 335 and the second pixel separation patterns 340. The second pixel separation pattern 340 may include barrier layers 341 forming sidewalls of the second pixel separation pattern 340 and a filling layer 342 disposed between the barrier layers 341.

Hereinafter, an image sensor according to some other embodiments of the present disclosure will be described with reference to FIG. 14. The following description will focus on differences from the image sensor shown in FIG. 10. For example, elements not mentioned below may be the same as any compatible/corresponding elements previously described.

Figure 14:
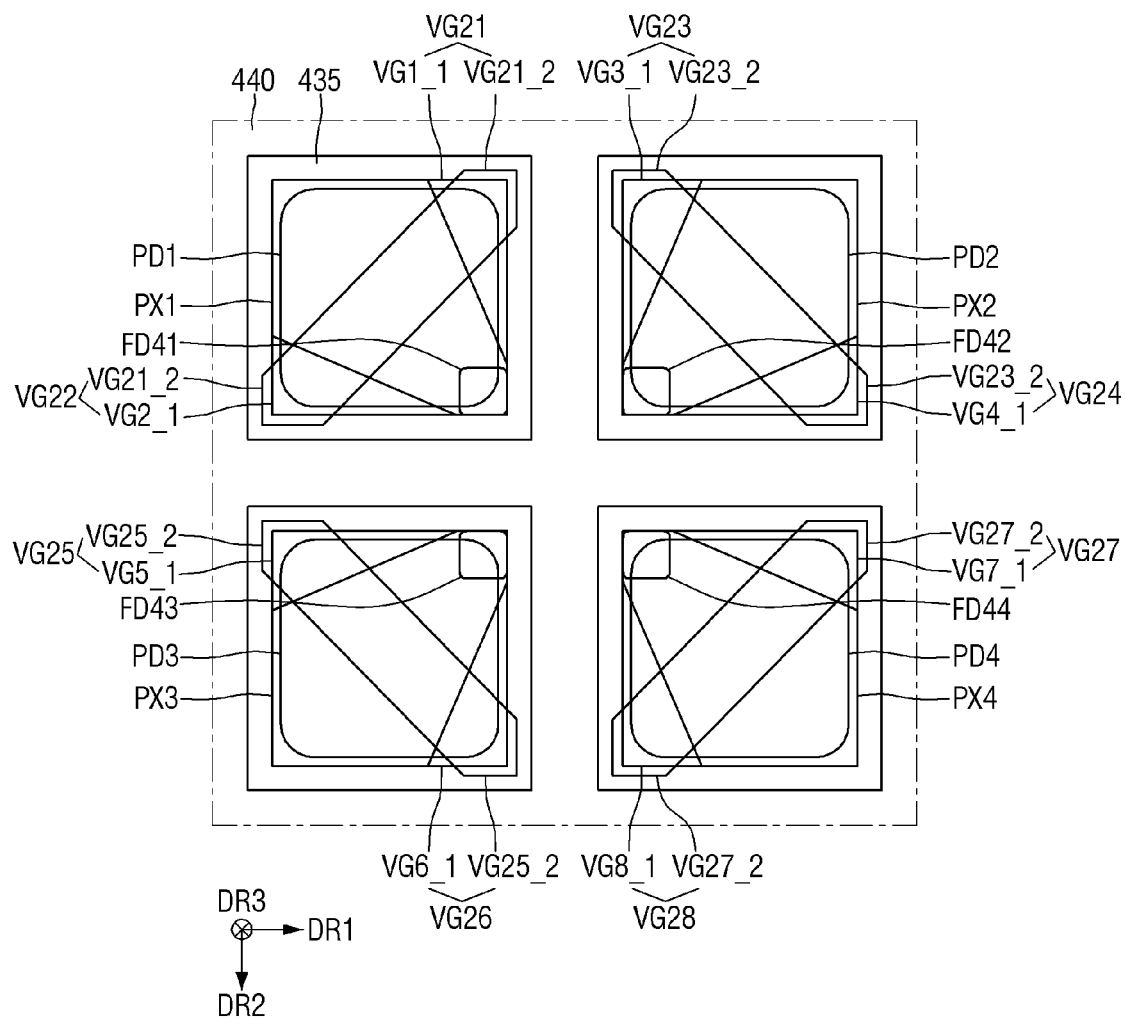
FIG. 14 is a plan view illustrating a vertical gate structure of an image sensor according to some other embodiments of the present disclosure.

FIG. 14 is a plan view illustrating a vertical gate structure of an image sensor according to some other embodiments of the present disclosure.

Referring to FIG. 14, in an image sensor according to some other embodiments of the present disclosure, individual floating diffusion regions FD41 to FD44 may be disposed in first to fourth pixel regions PX1 to PX4, respectively.

For example, the first floating diffusion region FD41 may be disposed between a first vertical gate structure VG21 and a second vertical gate structure VG22 at an edge of the first pixel region PX1. At an edge of the second pixel region PX2, the second floating diffusion region FD42 may be disposed between a third vertical gate structure VG23 and a fourth vertical gate structure VG24. At an edge of the third pixel region PX3, the third floating diffusion region FD43 may be disposed between a fifth vertical gate structure VG25 and a sixth vertical gate structure VG26. At an edge of the fourth pixel region PX4, the fourth floating diffusion region FD44 may be disposed between a seventh vertical gate structure VG27 and an eighth vertical gate structure VG28.

The first to fourth floating diffusion regions FD41 to FD44 may be spaced apart from each other in the first horizontal direction DR1 and/or the second horizontal direction DR2. The first to fourth floating diffusion regions FD41 to FD44 may be disposed symmetrically to each other with respect to a second pixel separation pattern 440, e.g., disposed between corresponding pair of the floating diffusion regions FD41 to FD44 and/or pixel regions PX1 to PX4. The first to fourth pixel regions PX1 to PX4 may be completely separated from each other by first pixel separation patterns 435 and the second pixel separation patterns 440.

Hereinafter, an image sensor according to some other embodiments of the present disclosure will be described with reference to FIGS. 15 to 16. The following description will focus on differences from the image sensor shown in FIGS. 1 to 9. For example, elements not mentioned below may be the same as any compatible/corresponding elements previously described.

Figure 15:
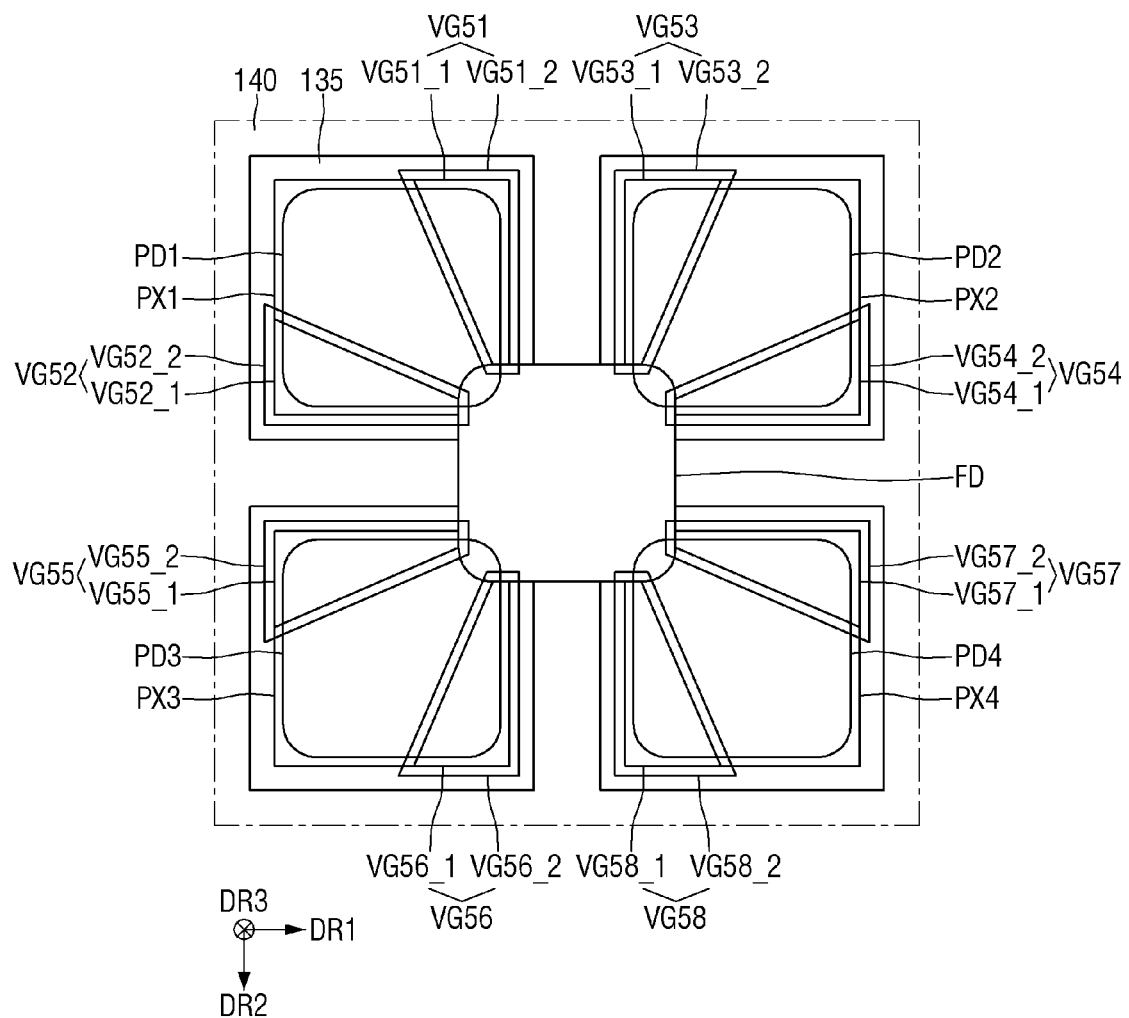
FIGS. 15 and 16 are plan views illustrating a vertical gate structure of an image sensor according to some other embodiments of the present disclosure.
Figure 16:
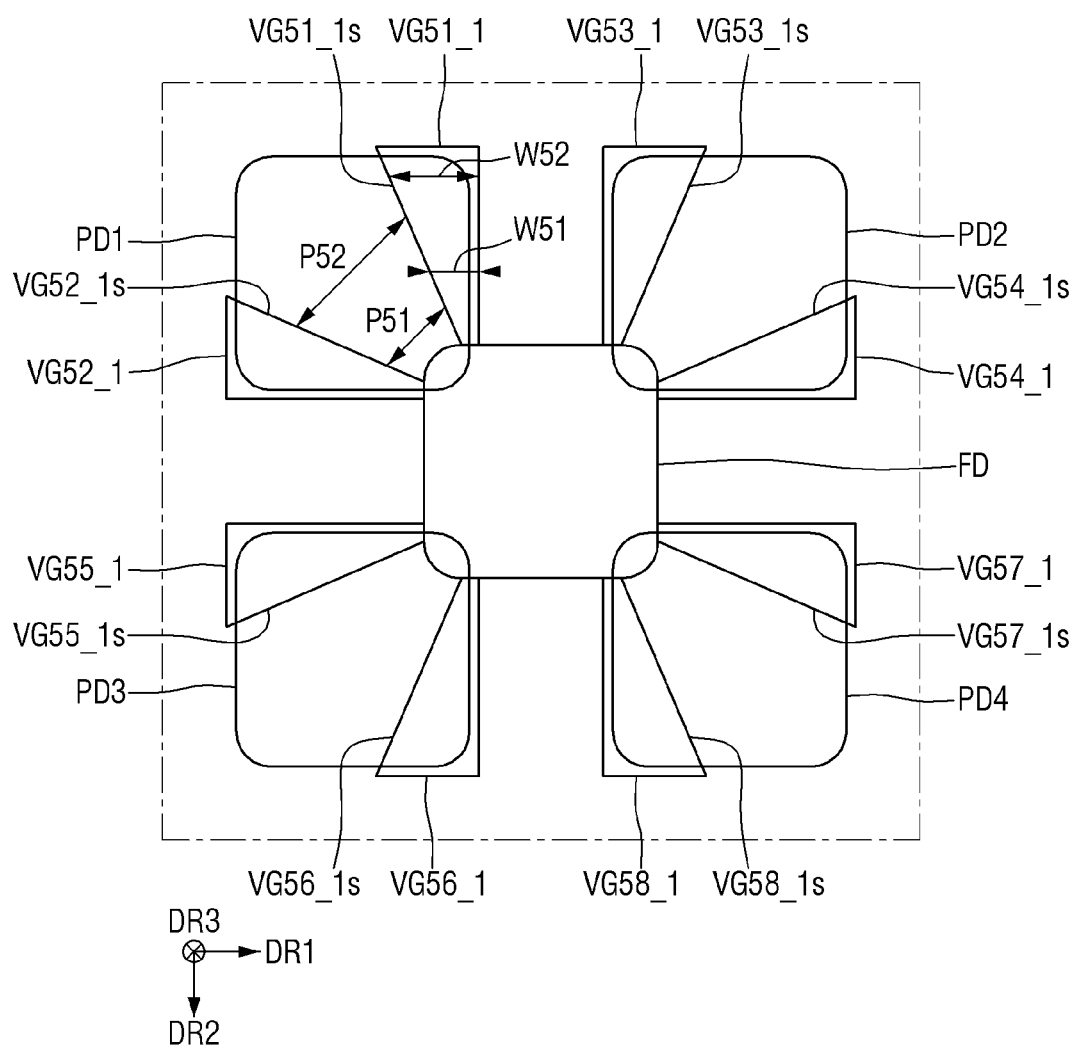

FIGS. 15 and 16 are plan views illustrating a vertical gate structure of an image sensor according to some other embodiments of the present disclosure.

Referring to FIGS. 15 and 16, in an image sensor according to some other embodiments of the present disclosure, the planar shape (e.g., a shape in a plan view) of each of first to eighth vertical gate structures VG51 to VG58 may be a trapezoidal shape.

For example, the planar shape of a first portion VG51_1 of the first vertical gate structure VG51 may be a trapezoidal shape. For example, one sidewall of the first portion VG51_1 of the first vertical gate structure VG51 may be disposed along a sidewall of a first pixel separation pattern 135 disposed between a first pixel region PX1 and a second pixel region PX2. The second portion VG51_2 of the first vertical gate structure VG51 may be disposed on the first portion VG51_1 of the first vertical gate structure VG51.

A width of the first portion VG51_1 of the first vertical gate structure VG51 in the first horizontal direction DR1 may gradually decrease in a direction approaching the floating diffusion region FD. For example, the width of the first portion VG51_1 of the first vertical gate structure VG51 in the first horizontal direction DR1 may decrease from a second width W52 to a first width W51 in a direction approaching the floating diffusion region FD.

The planar shape of a first portion VG52_1 of the second vertical gate structure VG52 may be a trapezoidal shape. For example, one sidewall of the first portion VG52_1 of the second vertical gate structure VG52 may be disposed along a sidewall of a first pixel separation pattern 135 disposed between the first pixel region PX1 and a third pixel region PX3. The second portion VG52_2 of the second vertical gate structure VG52 may be disposed on the first portion VG52_1 of the second vertical gate structure VG52. A width of the first portion VG52_1 of the second vertical gate structure VG52 in the second horizontal direction DR2 may gradually decrease in a direction approaching the floating diffusion region FD. For example, a planar shape (e.g., a shape in a plan view) of the second portion VG52_2 of the second vertical gate structure VG52 may be a trapezoidal shape.

The first portion VG51_1 of the first vertical gate structure VG51 may include a first sidewall VG51_1s facing the first portion VG52_1 of the second vertical gate structure VG52. The first portion VG52_1 of the second vertical gate structure VG52 may include a second sidewall VG52_1s facing the first portion VG51_1 of the first vertical gate structure VG51. Spacing/distances between the first portion VG51_1 of the first vertical gate structure VG51 and the first portion VG52_1 of the second vertical gate structure VG52 may decrease in a direction approaching the floating diffusion region FD. For example, spacing/distances between the first sidewall VG51_1s and the second sidewall VG52_1s may decrease from a second spacing P52 to a first spacing P52 in a direction approaching the floating diffusion region FD.

Each of the third and fourth vertical gate structures VG53 and VG54 may be disposed in the second pixel region PX2. Each of the third and fourth vertical gate structures VG53 and VG54 may have a similar structure to or the same structure as that of each of the first and second vertical gate structures VG51 and VG52. For example, the third vertical gate structure VG53 may be identical to the second vertical gate structure VG52 and the fourth vertical gate structure VG54 may be identical to the first vertical gate structure VG51. The third and fourth vertical gate structures VG53 and VG54 may be disposed symmetrically to the first and second vertical structures VG51 and VG52, respectively, with respect to the first and second pixel separation patterns 135 and 140 disposed between the first pixel region PX1 and the second pixel region PX2.

The third vertical gate structure VG53 may include a first portion VG53_1 disposed in the second substrate 130 and a second portion VG53_2 disposed on the first surface 130a of the second substrate 130. The fourth vertical gate structure VG54 may include a first portion VG54_1 disposed in the second substrate 130 and a second portion VG54_2 disposed on the first surface 130a of the second substrate 130.

The first portion VG53_1 of the third vertical gate structure VG53 may include a third sidewall VG53_1s facing the first portion VG54_1 of the fourth vertical gate structure VG54. The first portion VG54_1 of the fourth vertical gate structure VG54 may include a fourth sidewall VG54_1s facing the first portion VG53_1 of the third vertical gate structure VG53. Spacing/distances between the third sidewall VG53_1s and the fourth sidewall VG54_1s may decrease in a horizontal direction approaching the floating diffusion region FD.

Each of the fifth and sixth vertical gate structures VG55 and VG56 may be disposed in the third pixel region PX3. Each of the fifth and sixth vertical gate structures VG55 and VG56 may have a similar structure to or the same structure as that of each of the first and second vertical gate structures VG51 and VG52. For example, the fifth vertical gate structure VG55 may be identical to the first vertical gate structure VG51 and the sixth vertical gate structure VG56 may be identical to the second vertical gate structure VG52. The fifth and sixth vertical gate structures VG55 and VG56 may be disposed symmetrically to the first and second vertical structures VG51 and VG52, respectively, with respect to the first and second pixel separation patterns 135 and 140 disposed between the first pixel region PX1 and the third pixel region PX3.

The fifth vertical gate structure VG55 may include a first portion VG55_1 disposed in the second substrate 130 and a second portion VG55_2 disposed on the first surface 130a of the second substrate 130. The sixth vertical gate structure VG66 may include a first portion VG56_1 disposed in the second substrate 130 and a second portion VG56_2 disposed on the first surface 130a of the second substrate 130.

The first portion VG55_1 of the fifth vertical gate structure VG55 may include a fifth sidewall VG55_1s facing the first portion VG56_1 of the sixth vertical gate structure VG56. The first portion VG56_1 of the sixth vertical gate structure VG56 may include a sixth sidewall VG56_1s facing the first portion VG55_1 of the fifth vertical gate structure VG55. Spacing/distances between the fifth sidewall VG55_1s and the sixth sidewall VG56_1s may decrease in a horizontal direction approaching the floating diffusion region FD.

Each of the seventh and eighth vertical gate structures VG57 and VG58 may be disposed in the fourth pixel region PX4. Each of the seventh and eighth vertical gate structures VG57 and VG58 may have a similar structure to or the same structure as that of each of the first and second vertical gate structures VG51 and VG52. For example, the seventh vertical gate structure VG57 may be identical to the second vertical gate structure VG52 and the eighth vertical gate structure VG58 may be identical to the first vertical gate structure VG51. The seventh and eighth vertical gate structures VG57 and VG58 may be disposed symmetrically to the fifth and sixth vertical structures VG55 and VG56, respectively, with respect to the first and second pixel separation patterns 135 and 140 disposed between the third pixel region PX3 and the fourth pixel region PX4.

The seventh vertical gate structure VG57 may include a first portion VG57_1 disposed in the second substrate 130 and a second portion VG57_2 disposed on the first surface 130a of the second substrate 130. The eighth vertical gate structure VG58 may include a first portion VG58_1 disposed in the second substrate 130 and a second portion VG58_2 disposed on the first surface 130a of the second substrate 130.

The first portion VG57_1 of the seventh vertical gate structure VG57 may include a seventh sidewall VG57_1s facing the first portion VG58_1 of the eighth vertical gate structure VG58. The first portion VG58_1 of the eighth vertical gate structure VG58 may include an eighth sidewall VG58_1s facing the first portion VG57_1 of the seventh vertical gate structure VG57. Spacing/distances between the seventh sidewall VG57_1s and the eighth sidewall VG58_1s may decrease in a horizontal direction approaching the floating diffusion region FD.

Hereinafter, an image sensor according to some other embodiments of the present disclosure will be described with reference to FIG. 17. The following description will focus on differences from the image sensor shown in FIGS. 15 and 16. For example, elements not mentioned below may be the same as any compatible/corresponding elements previously described. For example, corresponding elements between embodiments are interchangeable/replaceable throughout the present disclosure.

Figure 17:
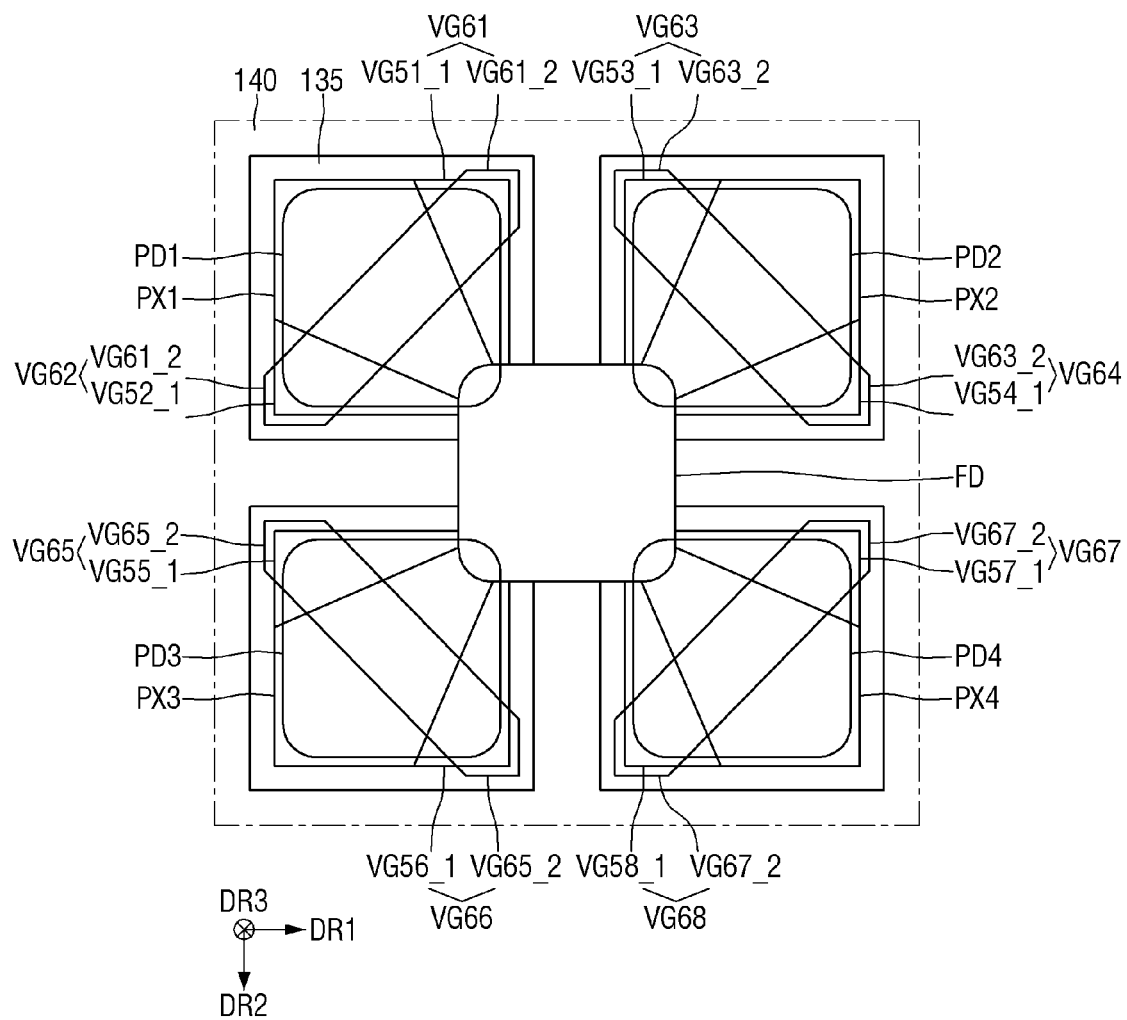
FIG. 17 is a plan view illustrating a vertical gate structure of an image sensor according to some other embodiments of the present disclosure.

FIG. 17 is a plan view illustrating a vertical gate structure of an image sensor according to some other embodiments of the present disclosure.

Referring to FIG. 17, in an image sensor according to some other embodiments of the present disclosure, a first vertical gate structure VG61 and a second vertical gate structure VG62 may be directly connected to each other, a third vertical gate structure VG63 and a fourth vertical gate structure VG64 may be directly connected to each other, a fifth vertical gate structure VG65 and a sixth vertical gate structure VG66 may be directly connected to each other, and a seventh vertical gate structure VG67 and an eighth vertical gate structure VG68 may be directly connected to each other.

For example, second portions VG61_2 of the first and second vertical gate structures VG61 and VG62 may be integrally formed (e.g., as one body—e.g., without any boundary or seam between the second portions VG61_2 of the first and second vertical gate structures VG61 and VG62) in a first pixel region PX1. In a second pixel region PX2, second portions VG63_2 of the third and fourth vertical gate structures VG63 and VG64 may be integrally formed. For example, the second portions VG63_2 of the third and fourth vertical gate structures VG63 and VG64 may be formed together without any boundary or seam between the second portions VG63_2 of the third and fourth vertical gate structures VG63 and VG64. In a third pixel region PX3, second portions VG65_2 of the fifth and sixth vertical gate structures VG65 and VG66 may be integrally formed, e.g., as one body. In a fourth pixel region PX4, second portions VG67_2 of the seventh and eighth vertical gate structures VG67 and VG68 may be integrally formed, e.g., as one body.

For example, the second portions VG63_2 of the third and fourth vertical gate structures VG63 and VG64 may be disposed symmetrically to the second portions VG61_2 of the first and second vertical gate structures VG61 and VG62 with respect to a second pixel separation pattern 140, e.g., disposed between the first and second pixel regions PX1 and PX2. The second portions VG65_2 of the fifth and sixth vertical gate structures VG65 and VG66 may be disposed symmetrically to the second portions VG61_2 of the first and second vertical gate structures VG61 and VG62 with respect to the second pixel separation pattern 140, e.g., disposed between the first and third pixel regions PX1 and PX3. The second portions VG67_2 of the seventh and eighth vertical gate structures VG67 and VG68 may be disposed symmetrically to the second portions VG65_2 of the fifth and sixth vertical gate structures VG65 and VG66 with respect to the second pixel separation pattern 140, e.g., disposed between the third and fourth pixel regions PX3 and PX4.

Hereinafter, an image sensor according to some other embodiments of the present disclosure will be described with reference to FIGS. 18 and 19. The following description will focus on differences from the image sensor shown in FIGS. 15 and 16. For example, elements not mentioned below may be the same as any compatible/corresponding elements previously described.

Figure 18:
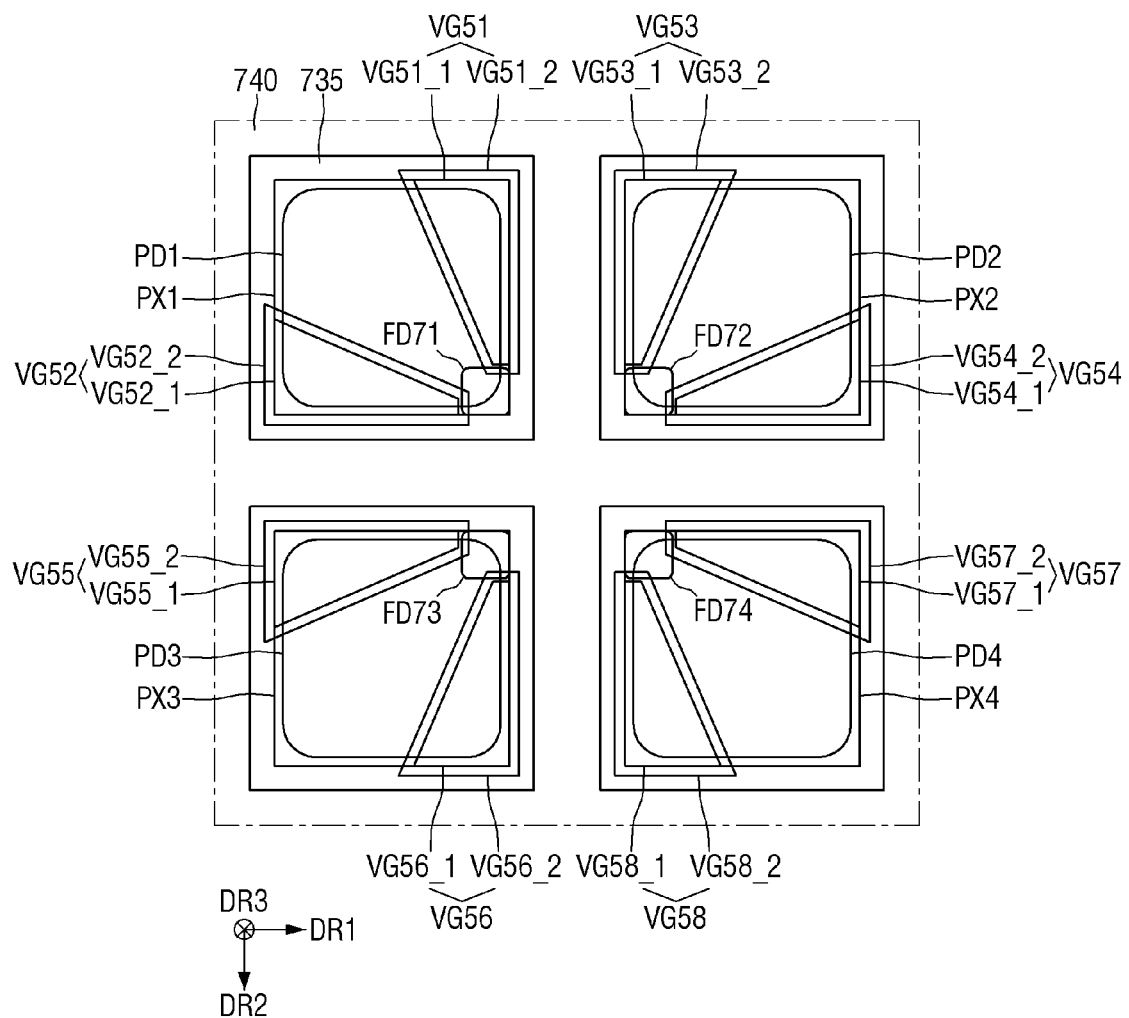
FIGS. 18 and 19 are plan views illustrating a vertical gate structure of an image sensor according to some other embodiments of the present disclosure.
Figure 19:
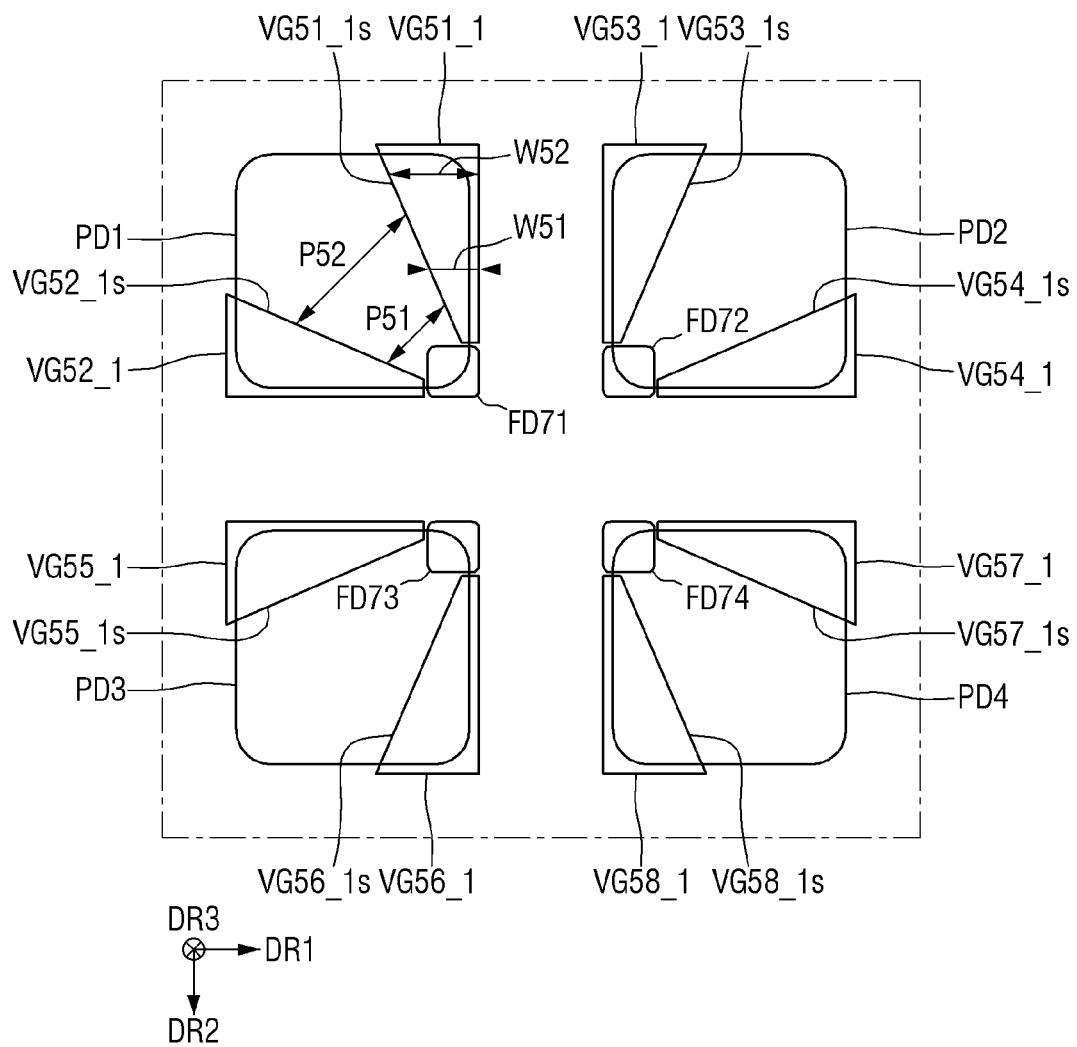

FIGS. 18 and 19 are plan views illustrating a vertical gate structure of an image sensor according to some other embodiments of the present disclosure.

Referring to FIGS. 18 and 19, in an image sensor according to some other embodiments of the present disclosure, individual floating diffusion regions FD71 to FD74 may be disposed in first to fourth pixel regions PX1 to PX4, respectively.

For example, the first floating diffusion region FD71 may be disposed between a first vertical gate structure VG51 and a second vertical gate structure VG52 at an edge of the first pixel region PX1. At an edge of the second pixel region PX2, the second floating diffusion region FD72 may be disposed between a third vertical gate structure VG53 and a fourth vertical gate structure VG54. At an edge of the third pixel region PX3, the third floating diffusion region FD73 may be disposed between a fifth vertical gate structure VG55 and a sixth vertical gate structure VG56. At an edge of the fourth pixel region PX4, the fourth floating diffusion region FD74 may be disposed between a seventh vertical gate structure VG57 and an eighth vertical gate structure VG58.

The first to fourth floating diffusion regions FD71 to FD74 may be spaced apart from each other in the first horizontal direction DR1 or the second horizontal direction DR2. Each pair of the first to fourth floating diffusion regions FD71 to FD74 may be disposed symmetrically to each other with respect to a second pixel separation pattern 740, e.g., disposed between the corresponding pair of the floating diffusion regions FD71 to FD74 and/or pixel regions PX1 to PX4. The first to fourth pixel regions PX1 to PX4 may be completely separated from each other by first pixel separation patterns 735 and the second pixel separation patterns 740.

Hereinafter, an image sensor according to some other embodiments of the present disclosure will be described with reference to FIG. 20. The following description will focus on differences from the image sensor shown in FIG. 17. For example, elements not mentioned below may be the same as compatible/corresponding elements described and/or assumed with respect to the embodiment shown in FIG. 17.

Figure 20:
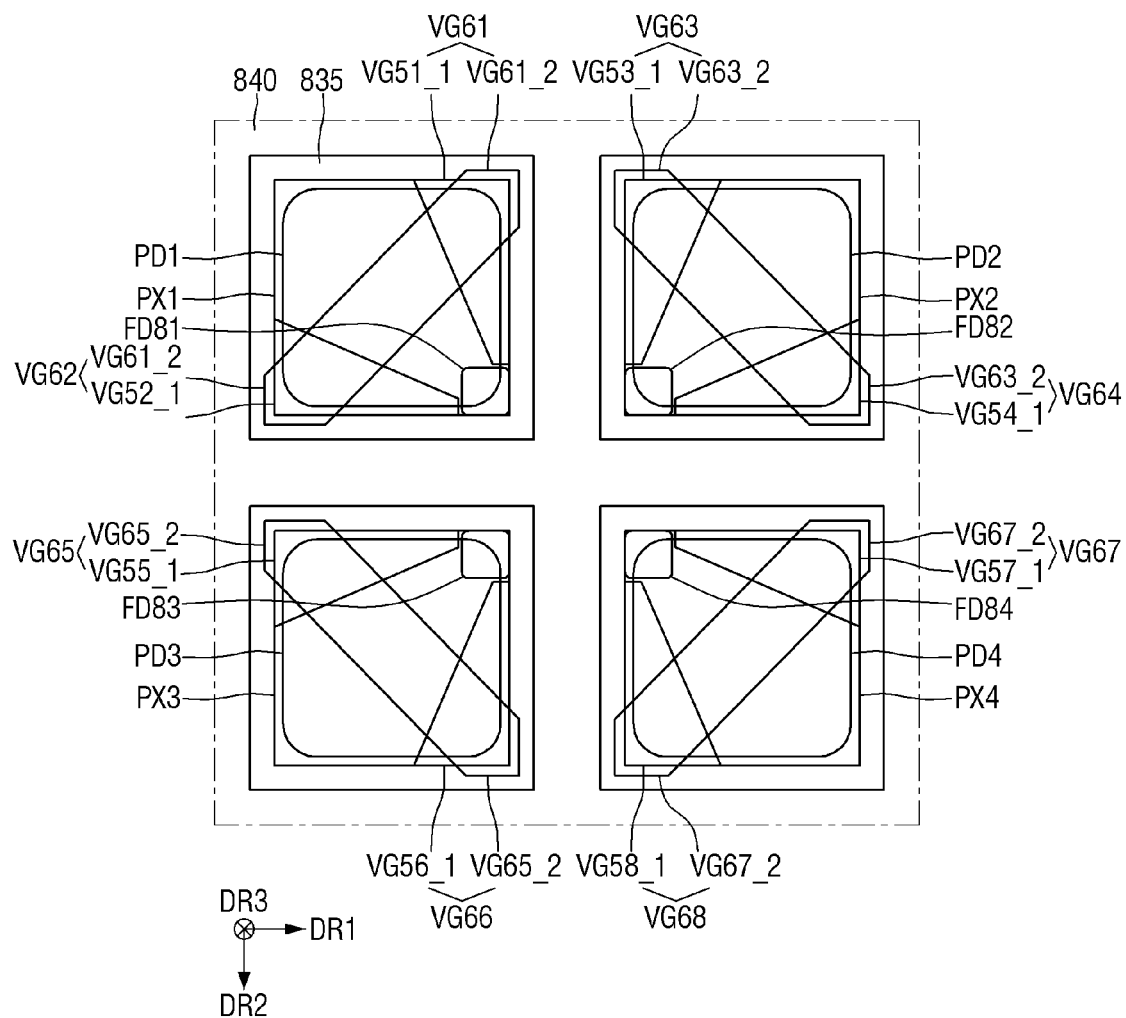
FIG. 20 is a plan view illustrating a vertical gate structure of an image sensor according to some other embodiments of the present disclosure.

FIG. 20 is a plan view illustrating a vertical gate structure of an image sensor according to some other embodiments of the present disclosure.

Referring to FIG. 20, in an image sensor according to some other embodiments of the present disclosure, individual floating diffusion regions FD81 to FD84 may be disposed in first to fourth pixel regions PX1 to PX4, respectively.

For example, the first floating diffusion region FD81 may be disposed between a first vertical gate structure VG61 and a second vertical gate structure VG62 at an edge of the first pixel region PX1. At an edge of the second pixel region PX2, the second floating diffusion region FD82 may be disposed between a third vertical gate structure VG63 and a fourth vertical gate structure VG64. At an edge of the third pixel region PX3, the third floating diffusion region FD83 may be disposed between a fifth vertical gate structure VG65 and a sixth vertical gate structure VG66. At an edge of the fourth pixel region PX4, the fourth floating diffusion region FD84 may be disposed between a seventh vertical gate structure VG67 and an eighth vertical gate structure VG68.

The first to fourth floating diffusion regions FD81 to FD84 may be spaced apart from each other in the first horizontal direction DR1 or the second horizontal direction DR2. Each pair of the first to fourth floating diffusion regions FD81 to FD84 may be disposed symmetrically to each other with respect to a second pixel separation pattern 840, e.g., disposed between the corresponding pair of the floating diffusion regions FD81 to FD84 and/or pixel regions PX1 to PX4. The first to fourth pixel regions PX1 to PX4 may be completely separated from each other by first pixel separation patterns 835 and the second pixel separation patterns 840.

Hereinafter, an image sensor according to some other embodiments of the present disclosure will be described with reference to FIGS. 21 and 22. The following description will focus on differences from the image sensor shown in FIGS. 1 to 9. For example, elements not mentioned below may be the same as any compatible/corresponding elements previously described.

Figure 21:
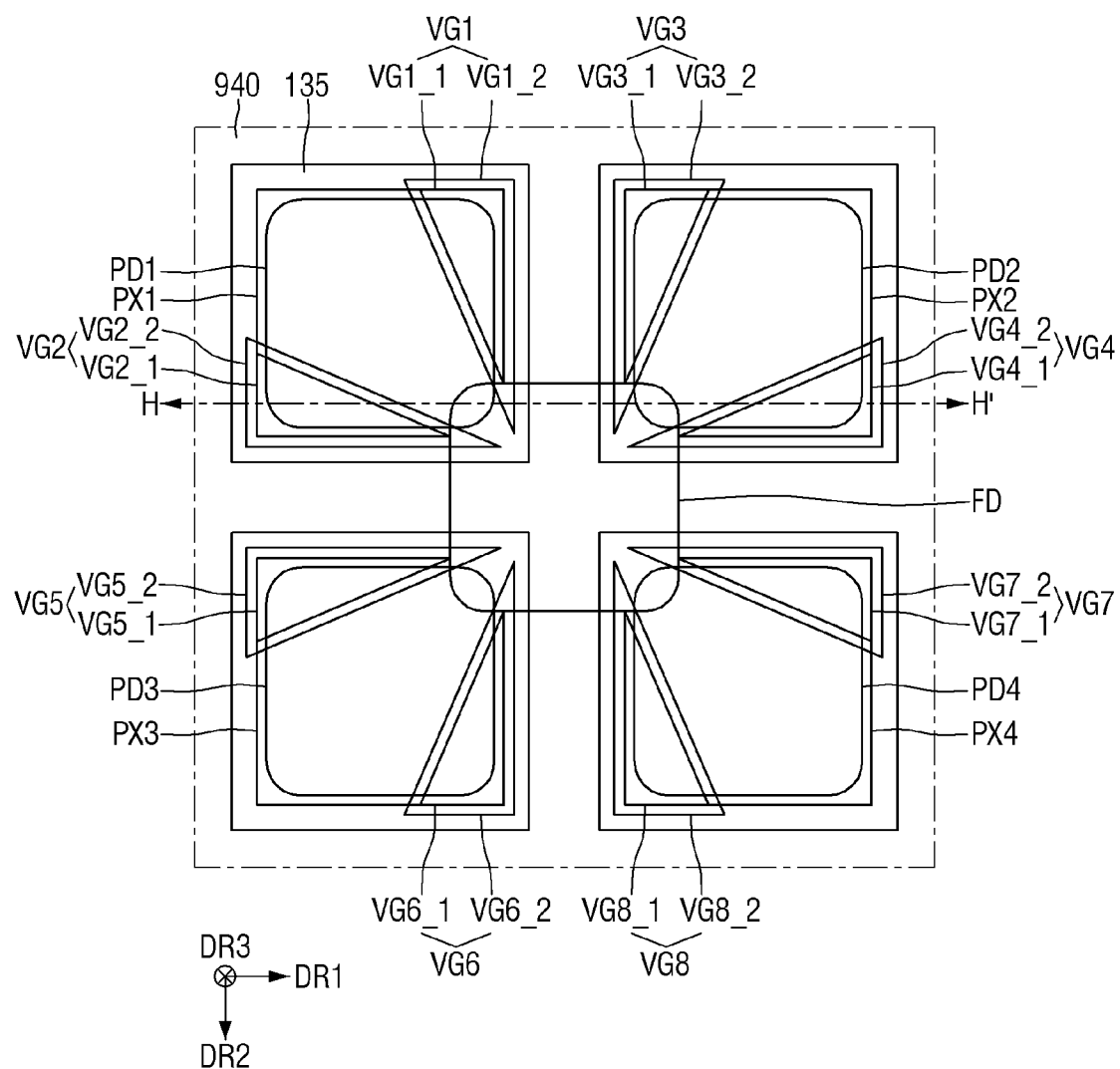
FIG. 21 is a plan view illustrating a vertical gate structure of an image sensor according to some other embodiments of the present disclosure.

FIG. 21 is a plan view illustrating a vertical gate structure of an image sensor according to some other embodiments of the present disclosure. FIG. 22 is a cross-sectional view taken along line H-H' of FIG. 21.

Figure 22:
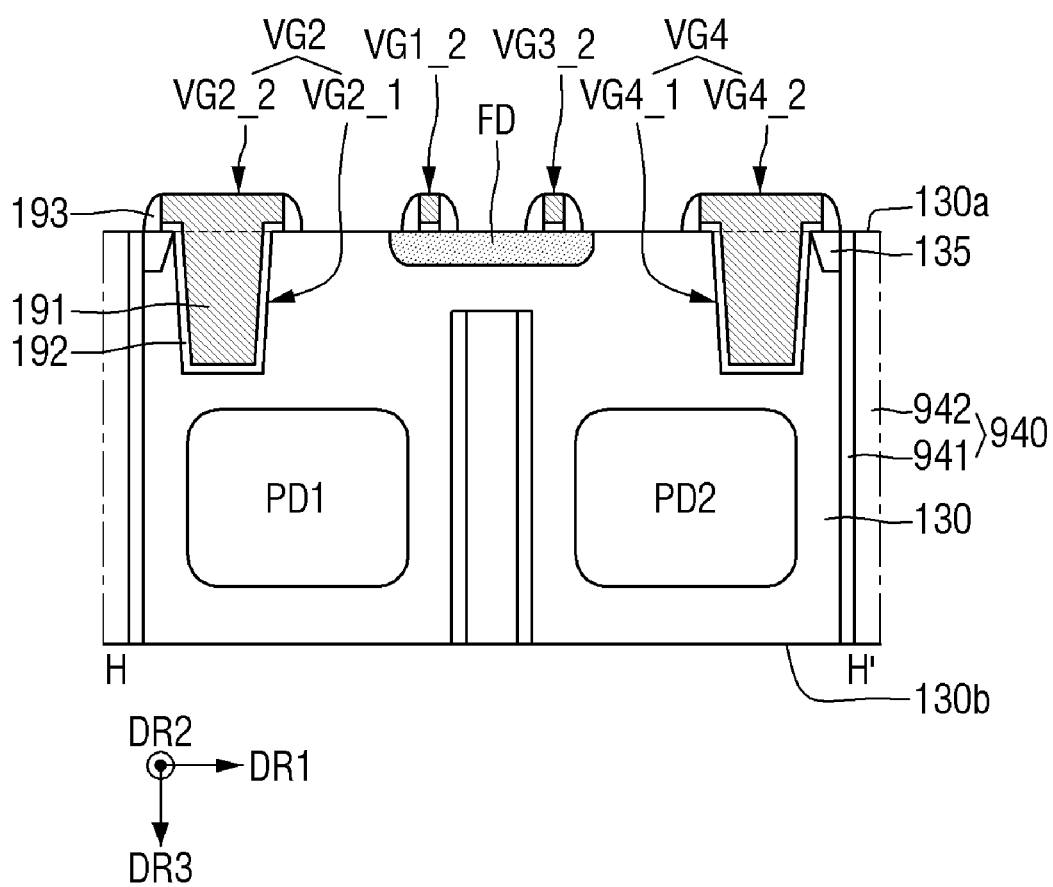
FIG. 22 is a cross-sectional view taken along line H-H' of FIG. 21.

Referring to FIGS. 21 and 22, in an image sensor according to some other embodiments of the present disclosure, a second pixel separation pattern 940 may overlap a floating diffusion region FD in the vertical direction DR3. For example, as shown in FIG. 22, a second pixel separation pattern 940 may be disposed under a floating diffusion region FD.

First to fourth photoelectric conversion elements PD1, PD2, PD3, and PD4 may be completely separated, e.g., isolated, from each other by the second pixel separation patterns 940. Also, first to fourth pixel regions PX1, PX2, PX3, and PX4 may be completely separated from each other by the second pixel separation patterns 940. Although FIG. 22 illustrates that the second pixel separation pattern 940 disposed under the floating diffusion region FD is spaced apart from the floating diffusion region FD in the vertical direction, the present disclosure is not limited thereto. In some other embodiments, the second pixel separation pattern 940 disposed under the floating diffusion region FD may be in contact with the floating diffusion region FD. In certain embodiments, the second pixel separation pattern 940 disposed under (or vertically overlapping) the floating diffusion region FD may also overlap the floating diffusion region FD in a horizontal direction.

The second pixel separation pattern 940 may include barrier layers 941 forming sidewalls of the second pixel separation pattern 940 and a filling layer 942 disposed between the barrier layers 941. For example, as shown in FIG. 22, the filing layer 942 facing the floating diffusion region FD may be in contact with a second substrate 130, but the present disclosure is not limited thereto. In some other embodiments, the barrier layer 941 may be disposed between the filling layer 942 facing the floating diffusion region FD and the floating diffusion region FD. For example, the barrier layer 941 may vertically overlap the filling layer 942 in certain embodiments. For example, the barrier layers 941 may completely surround the filling layer 942 in the second substrate 130.

Though different figures show variations of exemplary embodiments, these figures are not necessarily intended to be mutually exclusive from each other. Rather, as recognized from the context of the detailed description above, certain features depicted in different figures and/or described above can be combined with other features from other figures/embodiments to result in additional various embodiments, when taking the figures and related descriptions as a whole into consideration.

While the present disclosure has been particularly shown and described with reference to example embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the present disclosure.

What is claimed:

1. An image sensor comprising:
    a substrate in which a first photoelectric conversion element is disposed, the substrate having a first surface and a second surface opposite the first surface;
    pixel separation patterns extending from the first surface of the substrate into the substrate, surrounding the first photoelectric conversion element, and defining a first pixel region in the substrate;
    a first vertical gate structure which extends in the first pixel region from the first surface of the substrate into the substrate and comprises a first portion disposed in the substrate and a second portion disposed on the first surface of the substrate;
    a second vertical gate structure which is directly adjacent to the first vertical gate structure such that there are no intervening vertical gate structures between the first vertical gate structure and the second vertical gate structure, the second vertical gate structure extending in the first pixel region from the first surface of the substrate into the substrate, the second vertical gate structure including a first portion disposed in the substrate and a second portion disposed on the first surface of the substrate; and
    a floating diffusion region which is disposed at an edge of the first pixel region in the substrate, is disposed between the first portion of the first vertical gate structure and the first portion of the second vertical gate structure, and has an upper surface formed on the same plane as the first surface of the substrate,
    wherein a width of the first portion of the first vertical gate structure in a horizontal direction gradually decreases in a horizontal direction approaching the floating diffusion region,
    the first portion of the first vertical gate structure comprises a first sidewall facing the first portion of the second vertical gate structure, the first portion of the second vertical gate structure comprises a second sidewall facing the first portion of the first vertical gate structure, and spacing between the first sidewall and the second sidewall decreases in a horizontal direction approaching the floating diffusion region.

2. The image sensor of claim 1, wherein each of the first portion of the first vertical gate structure and the first portion of the second vertical gate structure has a triangular shape in a plan view.

3. The image sensor of claim 2, wherein an angle between two sidewalls of the first portion of the first vertical gate structure on a horizontal plane at a closest vertex to the floating diffusion region is greater than or equal to 30 degrees and less than 45 degrees.

4. The image sensor of claim 1, wherein each of the first portion of the first vertical gate structure and the first portion of the second vertical gate structure has a trapezoidal shape in a plan view.

5. The image sensor of claim 1, further comprising:
a second pixel region which has at least a portion separated from the first pixel region by a pixel separation pattern and is defined by the pixel separation patterns;
a third vertical gate structure which extends in the second pixel region from the first surface of the substrate into the substrate and comprises a first portion disposed in the substrate and a second portion disposed on the first surface of the substrate; and
a fourth vertical gate structure which extends in the second pixel region from the first surface of the substrate into the substrate, the fourth vertical gate structure including a first portion disposed in the substrate and a second portion disposed on the first surface of the substrate,
wherein the first portion of the third vertical gate structure comprises a third sidewall facing the first portion of the fourth vertical gate structure,
the first portion of the fourth vertical gate structure comprises a fourth sidewall facing the first portion of the third vertical gate structure, and
spacing between the third sidewall and the fourth sidewall decreases in a horizontal direction approaching the floating diffusion region.

6. The image sensor of claim 5, wherein the first vertical gate structure and the third vertical gate structure are symmetrically disposed with respect to the pixel separation pattern, and
the second vertical gate structure and the fourth vertical gate structure are symmetrically disposed with respect to the pixel separation pattern.

7. The image sensor of claim 5, wherein the floating diffusion region is disposed over the first pixel region and the second pixel region.

8. The image sensor of claim 5, wherein the floating diffusion region comprises a first floating diffusion region disposed at the edge of the first pixel region and a second floating diffusion region disposed at an edge of the second pixel region and spaced apart from the first floating diffusion region.

9. The image sensor of claim 8, wherein the first floating diffusion region and the second floating diffusion region are symmetrically disposed with respect to the pixel separation pattern.

10. The image sensor of claim 1, wherein the second portion of the first vertical gate structure and the second portion of the second vertical gate structure are integrally formed.

11. The image sensor of claim 1, wherein a width of the second portion of the first vertical gate structure in the horizontal direction is greater than the width of the first portion of the first vertical gate structure in the horizontal direction.

12. An image sensor comprising:
a substrate in which a first photoelectric conversion element and a second photoelectric conversion element are disposed, the substrate having a first surface and a second surface opposite the first surface;
pixel separation patterns which extend from the first surface of the substrate into the substrate, surround each of the first and second photoelectric conversion elements, and define a first pixel region in which the first photoelectric conversion element is disposed and a second pixel region in which the second photoelectric conversion element is disposed in the substrate;
a first vertical gate structure which extends in the first pixel region from the first surface of the substrate into the substrate and comprises a first portion disposed in the substrate and a second portion disposed on the first surface of the substrate;
a second vertical gate structure which is directly adjacent to the first vertical gate structure such that there are no intervening vertical gate structures between the first vertical gate structure and the second vertical gate structure, the second vertical gate structure extending in the first pixel region from the first surface of the substrate into the substrate, the second vertical gate structure including a first portion disposed in the substrate and a second portion disposed on the first surface of the substrate;
a third vertical gate structure which extends in the second pixel region from the first surface of the substrate into the substrate and comprises a first portion disposed in the substrate and a second portion disposed on the first surface of the substrate;
a fourth vertical gate structure which extends in the second pixel region from the first surface of the substrate into the substrate, the fourth vertical gate structure including a first portion disposed in the substrate and a second portion disposed on the first surface of the substrate; and
floating diffusion regions each of which is disposed at an edge of one of the first and second pixel regions in the substrate, the floating diffusion regions respectively disposed between the first portion of the first vertical gate structure and the first portion of the second vertical gate structure and between the first portion of the third vertical gate structure and the first portion of the fourth vertical gate structure, and each of the floating diffusion regions has an upper surface formed on the same plane as the first surface of the substrate,
wherein the first portion of the first vertical gate structure comprises a first sidewall facing the first portion of the second vertical gate structure,
the first portion of the second vertical gate structure comprises a second sidewall facing the first portion of the first vertical gate structure, and
spacing between the first sidewall and the second sidewall decreases in a horizontal direction approaching the floating diffusion region disposed at the edge of the first pixel region.

13. The image sensor of claim 12, wherein the first portion of the third vertical gate structure comprises a third sidewall facing the first portion of the fourth vertical gate structure, the first portion of the fourth vertical gate structure comprises a fourth sidewall facing the first portion of the third vertical gate structure, and spacing between the third sidewall and the fourth sidewall decreases in a direction approaching the floating diffusion region disposed at the edge of the second pixel region.

14. The image sensor of claim 12, wherein each of the first portion of the first vertical gate structure, the first portion of the second vertical gate structure, the first portion of the third vertical gate structure, and the first portion of the fourth vertical gate structure has a triangular shape in a plan view.

15. The image sensor of claim 12, wherein each of the first portion of the first vertical gate structure and the first portion of the second vertical gate structure has a trapezoidal shape in a plan view.

16. The image sensor of claim 12, wherein the floating diffusion regions are respectively disposed over the first pixel region and the second pixel region.

17. The image sensor of claim 12, wherein the floating diffusion regions comprise a first floating diffusion region disposed at the edge of the first pixel region and a second floating diffusion region disposed at an edge of the second pixel region and spaced apart from the first floating diffusion region.

18. The image sensor of claim 12, wherein the second portion of the first vertical gate structure and the second portion of the second vertical gate structure are integrally formed, and the second portion of the third vertical gate structure and the second portion of the fourth vertical gate structure are integrally formed.

19. The image sensor of claim 18, wherein the integrally formed second portions of the first and second vertical gate structures are symmetrically disposed to the integrally formed second portions of the third and fourth vertical gate structures with respect to a pixel separation pattern disposed between the first pixel region and the second pixel region.

20. An image sensor comprising:
a substrate in which a first photoelectric conversion element is disposed, the substrate having a first surface and a second surface opposite the first surface;
pixel separation patterns extending from the first surface of the substrate into the substrate, surrounding the first photoelectric conversion element, and defining a first pixel region in the substrate;
a first vertical gate structure which extends in the first pixel region from the first surface of the substrate into the substrate and comprises a first portion disposed in the substrate and a second portion disposed on the first surface of the substrate;
a second vertical gate structure which is directly adjacent to the first vertical gate structure such that there are no intervening vertical gate structures between the first vertical gate structure and the second vertical gate structure, the second vertical gate structure extending in the first pixel region from the first surface of the substrate into the substrate, the second vertical gate structure including a first portion disposed in the substrate and a second portion disposed on the first surface of the substrate; and
a floating diffusion region which is disposed at an edge of the first pixel region in the substrate, is disposed between the first portion of the first vertical gate structure and the first portion of the second vertical gate structure, has an upper surface formed on the same plane as the first surface of the substrate, and does not overlap the pixel separation patterns in a vertical direction, wherein each of the first portion of the first vertical gate structure and the first portion of the second vertical gate structure has a triangular shape in a plan view, an angle between two sidewalls of the first portion of the first vertical gate structure on a horizontal plane at a closest vertex to the floating diffusion region is greater than or equal to 30 degrees and less than 45 degrees, an angle between two sidewalls of the first portion of the second vertical gate structure on a horizontal plane at a closest vertex to the floating diffusion region is greater than or equal to 30 degrees and less than 45 degrees, the first portion of the first vertical gate structure comprises a first sidewall facing the first portion of the second vertical gate structure, the first portion of the second vertical gate structure comprises a second sidewall facing the first portion of the first vertical gate structure, and spacing between the first sidewall and the second sidewall decreases in a horizontal direction approaching the floating diffusion region.

* * * * *